United States Patent
Okamoto et al.

(10) Patent No.: US 10,578,941 B2
(45) Date of Patent: Mar. 3, 2020

(54) ACTIVE MATRIX SUBSTRATE, DISPLAY PANEL, AND DISPLAY DEVICE PROVIDED WITH SAME

(71) Applicant: Sharp Kabushiki Kaisha, Sakai, Osaka (JP)

(72) Inventors: Shota Okamoto, Sakai (JP); Youhei Nakanishi, Sakai (JP); Masayuki Kanehiro, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/334,772

(22) PCT Filed: Sep. 22, 2017

(86) PCT No.: PCT/JP2017/034284
§ 371 (c)(1),
(2) Date: Mar. 20, 2019

(87) PCT Pub. No.: WO2018/062035
PCT Pub. Date: Apr. 5, 2018

(65) Prior Publication Data
US 2019/0235338 A1 Aug. 1, 2019

(30) Foreign Application Priority Data
Sep. 29, 2016 (JP) .................................. 2016-191930

(51) Int. Cl.
*G02F 1/1362* (2006.01)
*H01L 27/12* (2006.01)
(Continued)

(52) U.S. Cl.
CPC .......... *G02F 1/136286* (2013.01); *G02F 1/13* (2013.01); *G02F 1/1343* (2013.01);
(Continued)

(58) Field of Classification Search
None
See application file for complete search history.

(56) References Cited

U.S. PATENT DOCUMENTS

2008/0143903 A1* 6/2008 Ahn .................. G02F 1/136286
349/38
2011/0281489 A1 11/2011 Tannas, Jr.
2015/0293546 A1 10/2015 Tanaka et al.

FOREIGN PATENT DOCUMENTS

JP 10-186392 A 7/1998
JP 2013-532304 A 8/2013
(Continued)

*Primary Examiner* — Phu Vu
(74) *Attorney, Agent, or Firm* — Keating & Bennett, LLP

(57) ABSTRACT

In the present disclosure, regions where a short circuit may have occurred due to dividing are isolated from a display region. In a gate line (13G) of an $n^{th}$ row, a gate line detour section (50G) that is provided corresponding to an intersection ($C_{G,n,m}$) with a source line (15S) of an $m^{th}$ column has: a start section (51G) which is bent toward the −Y direction from a start position ($X_{G,m}^{(1)}$, $Y_{G,n}$) that is in the −X direction relative to the intersection; and straddling sections (52G) which straddle a straight line ($X = X_{S,m} + d_S/2$) that passes through a +X direction end of the intersection and extends in the Y axis direction.

16 Claims, 13 Drawing Sheets

(51) Int. Cl.
*G02F 1/1368* (2006.01)
*G02F 1/1343* (2006.01)
*G02F 1/13* (2006.01)
*G09F 9/30* (2006.01)

(52) U.S. Cl.
CPC .............. *G02F 1/1368* (2013.01); *G09F 9/30* (2013.01); *H01L 27/124* (2013.01); *H01L 27/1244* (2013.01)

(56) References Cited

FOREIGN PATENT DOCUMENTS

| | | |
|---|---|---|
| JP | 2017-78793 A | 4/2017 |
| WO | 2014/069529 A1 | 5/2014 |

\* cited by examiner

ACTIVE MATRIX SUBSTRATE, DISPLAY PANEL, AND DISPLAY DEVICE PROVIDED WITH SAME

TECHNICAL FIELD

The present disclosure relates to an active matrix substrate, a display panel, and a display device provided with the same, and particularly relates to altering the size of an active matrix substrate and a display panel including the same.

BACKGROUND ART

In display panels such as liquid crystal displays and electronic flat panel displays, there is a demand for altering the size of the display panel.

However, when a display panel provided with an active matrix substrate is mechanically divided in order to alter the size, a short circuit may occur near the dividing line. This short circuit then causes a display defect in the display panel after the size alteration.

In the invention described in PTL 1, in order to prevent a display defect caused by this short circuit, it is disclosed that short circuits are detected and repaired after a liquid crystal display has been divided.

In the invention described in PTL 2, as a method for dividing wiring or electrodes on a substrate without dividing the substrate itself, a method is disclosed in which laser light is scanned on the substrate and the material of the wiring or electrodes in a laser light irradiated region is evaporated.

CITATION LIST

Patent Literature

PTL 1: Japanese Unexamined Patent Application Publication (Translation of PCT Application) No. 2013-532304 (published on Aug. 15, 2013)

PTL 2: Japanese Unexamined Patent Application Publication No. 10-186392 (published on Jul. 14, 1998)

PTL 3: International Publication No. WO2014/069529 (published on May 8, 2014)

SUMMARY OF INVENTION

Technical Problem

In the invention described in the aforementioned PTL 1, short circuits are detected and repaired after a display panel has been divided, and a display region of the divided display panel is connected to the portions where the short circuits have been repaired. Therefore, there is a problem in that if a repaired short circuit reoccurs, a display defect reoccurs in the display panel.

The present disclosure takes the aforementioned problem into consideration, and an objective thereof is to realize an active matrix substrate with which regions where a short circuit may have occurred due to dividing can be isolated from a display region.

Solution to Problem

In order to solve the aforementioned problem, an active matrix substrate according to one aspect of the present disclosure is a configuration including: a plurality of source lines including a plurality of first source lines that transmit a first source signal from a −Y direction toward a +Y direction; and a plurality of gate lines that intersect the plurality of first source lines only at a plurality of first intersections, and transmit a gate signal from a −X direction toward a +X direction, in the gate lines, gate line detour sections being provided corresponding to each of the first intersections, and each of the gate line detour sections having: a first start section in which the corresponding gate line is bent toward the +Y direction or the −Y direction from a first start position that is in the −X direction relative to the corresponding first intersection; and first straddling sections in which the corresponding gate line straddles a first straight line that passes through a +X direction end of the corresponding first intersection and extends in the +Y direction and the −Y direction.

Advantageous Effects of Invention

According to one aspect of the present disclosure, an effect is demonstrated in which regions where a short circuit may have occurred due to dividing can be isolated from a display region.

DESCRIPTION OF EMBODIMENTS

Embodiment 1

Hereinafter, one embodiment of the present disclosure will be described in detail with reference to FIGS. 1, 2, 3, and 4.

(Configuration of Liquid Crystal Display Device)

Figure 1:
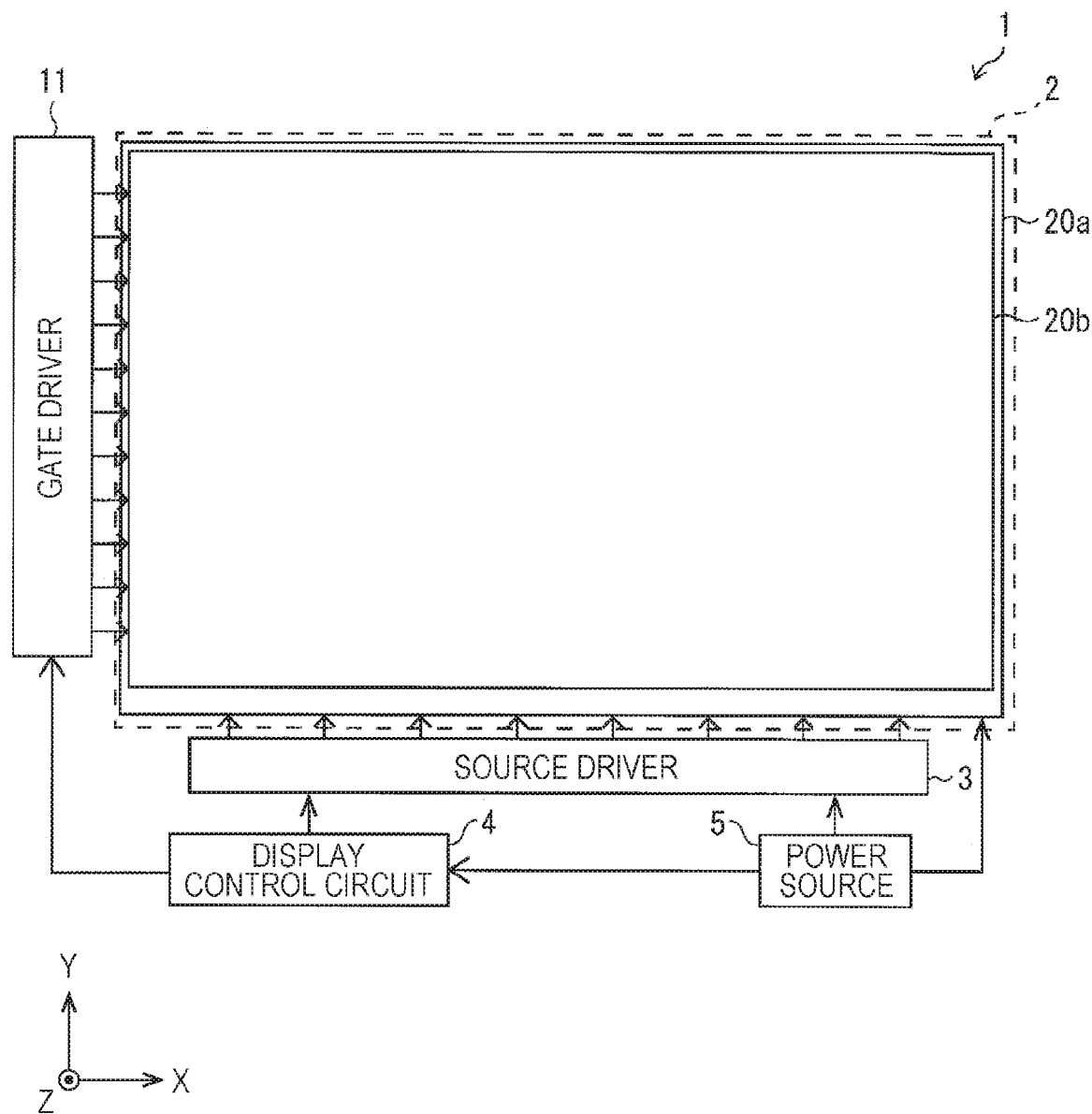
FIG. 1 is a top view depicting a schematic configuration of a liquid crystal display device according to several embodiments of the present disclosure.

FIG. 1 is a top view depicting a schematic configuration of a liquid crystal display device 1 according to the present embodiment.

The liquid crystal display device 1 (display device) is provided with a display panel 2, a source driver 3, a gate driver 11 (gate driving circuit), a display control circuit 4, and a power source 5. The display panel 2 is provided with an active matrix substrate 20a, an opposite substrate 20b, and a liquid crystal layer (not depicted) held between the active matrix substrate 20a and the opposite substrate 20b. Although not depicted in FIG. 1, a polarizer is provided at the lower surface side (−Z side) of the active matrix substrate 20a and the upper surface side (+Z side) of the opposite substrate 20b. A black matrix, three color filters of red (R), green (G), and blue (B), and a common electrode (none depicted) are formed on the opposite substrate 20b.

As depicted in FIG. 1, the active matrix substrate 20a is electrically connected to the source driver 3 and the gate driver 11, which are formed on a flexible substrate. The display control circuit 4 is electrically connected to the display panel 2, the source driver 3, the gate driver 11, and the power source 5. The display control circuit 4 outputs control signals to the source driver 3 and the gate driver 11. The control signals include a reset signal, a clock signal, a source signal, and the like for displaying images on the display panel 2. The power source 5 is electrically connected to the display panel 2, the source driver 3, and the display control circuit 4, and supplies power source voltage signals to each thereof.

(Configuration of Active Matrix Substrate)

Figure 2:
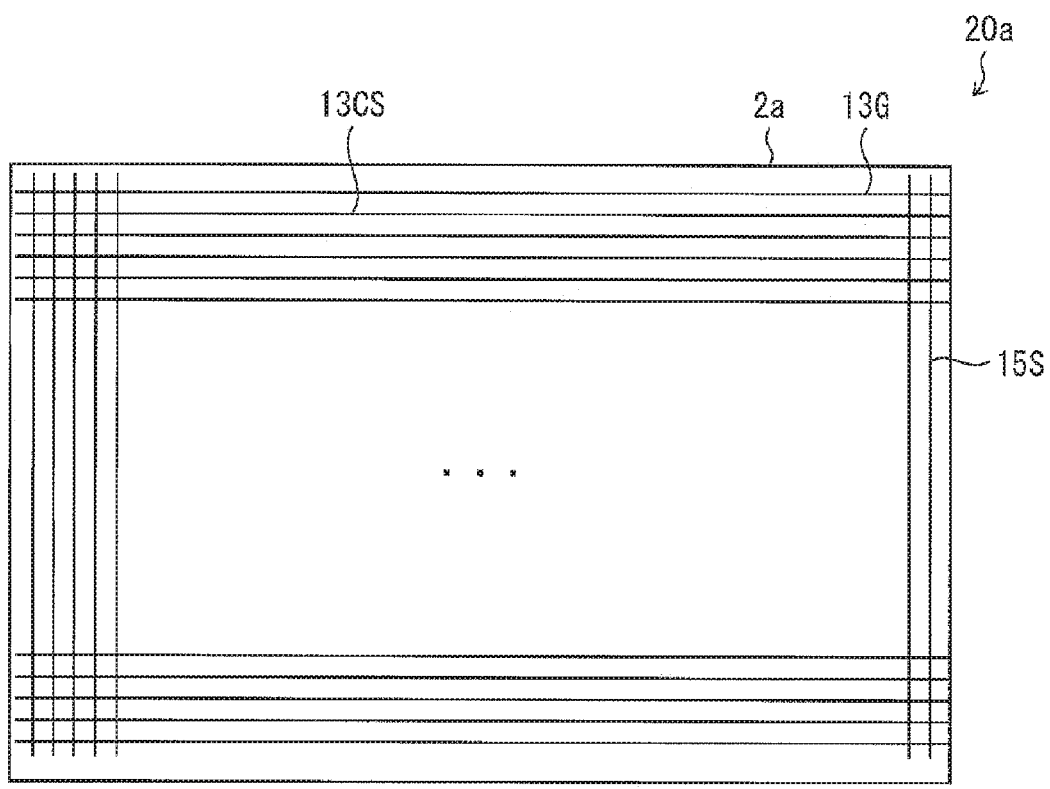
FIG. 2 is a top view depicting a schematic configuration of an active matrix substrate according to several embodiments of the present disclosure.

FIG. 2 is a top view depicting a schematic configuration of the active matrix substrate 20a.

The active matrix substrate 20a includes an insulating substrate 2a such as a glass substrate, and N gate lines 13G, N auxiliary capacitance lines 13CS, and M source lines 15S that are formed on the insulating substrate 2a (N and M are natural numbers that are greater than or equal to 2).

The N gate lines 13G are formed to be substantially parallel at substantially equal intervals from one end (−X direction end) of the insulating substrate 2a to the other end (+X direction end) in the X axis direction. The N auxiliary capacitance lines 13CS are also similarly formed to be substantially parallel at substantially equal intervals from one end (−X direction end) of the insulating substrate 2a to the other end (+X direction end). Furthermore, the M source lines 15S (first source lines and second source lines) are formed to be substantially parallel at substantially equal intervals from one end (−Y direction end) of the insulating substrate 2a to the other end (+Y direction end) in the Y axis direction so as to intersect the N gate lines 13G and the N auxiliary capacitance lines 13CS.

The N gate lines 13G are electrically connected to the gate driver 11, and transmit gate signals generated by the gate driver 11 from the −X direction toward the +X direction. The N auxiliary capacitance lines 13CS also similarly transmit auxiliary capacitance voltages (auxiliary capacitance signals) from the −X direction toward the +X direction. The M source lines 15S are electrically connected to the source driver 3, and transmit source signals (first source signals and second source signals) generated by the source driver 3 from the −Y direction toward the +Y direction. The X axis and the Y axis are substantially orthogonal.

Each region enclosed by the gate lines 13G and the source lines 15S is a pixel region, and, although not depicted in FIG. 2, one pixel electrode and one switching element (first switching element) are formed in each pixel region. Each pixel electrode corresponds to any color of the color filters, and is connected to a gate line 13G and a source line 15S via a switching element. The switching elements are thin film transistors (TFTs), for example, and the gate electrodes of the TFTs are arranged on the insulating substrate 2a similar to the gate lines 13G and are connected to the corresponding gate lines 13G. Furthermore, the source electrodes and the drain electrodes of the TFTs are arranged on a gate insulating film similar to the source lines 15S being arranged on an insulating film, and are connected to the corresponding source lines 15S and pixel electrodes.

In FIG. 2, one auxiliary capacitance line 13CS is provided with respect to one gate line 13G, and the gate lines 13G and the auxiliary capacitance lines 13CS are arranged in an alternating manner. There is no restriction thereto, and a plurality of auxiliary capacitance lines 13CS may be provided with respect to one gate line 13G.

(Dividing of Display Panel)

Figure 3:
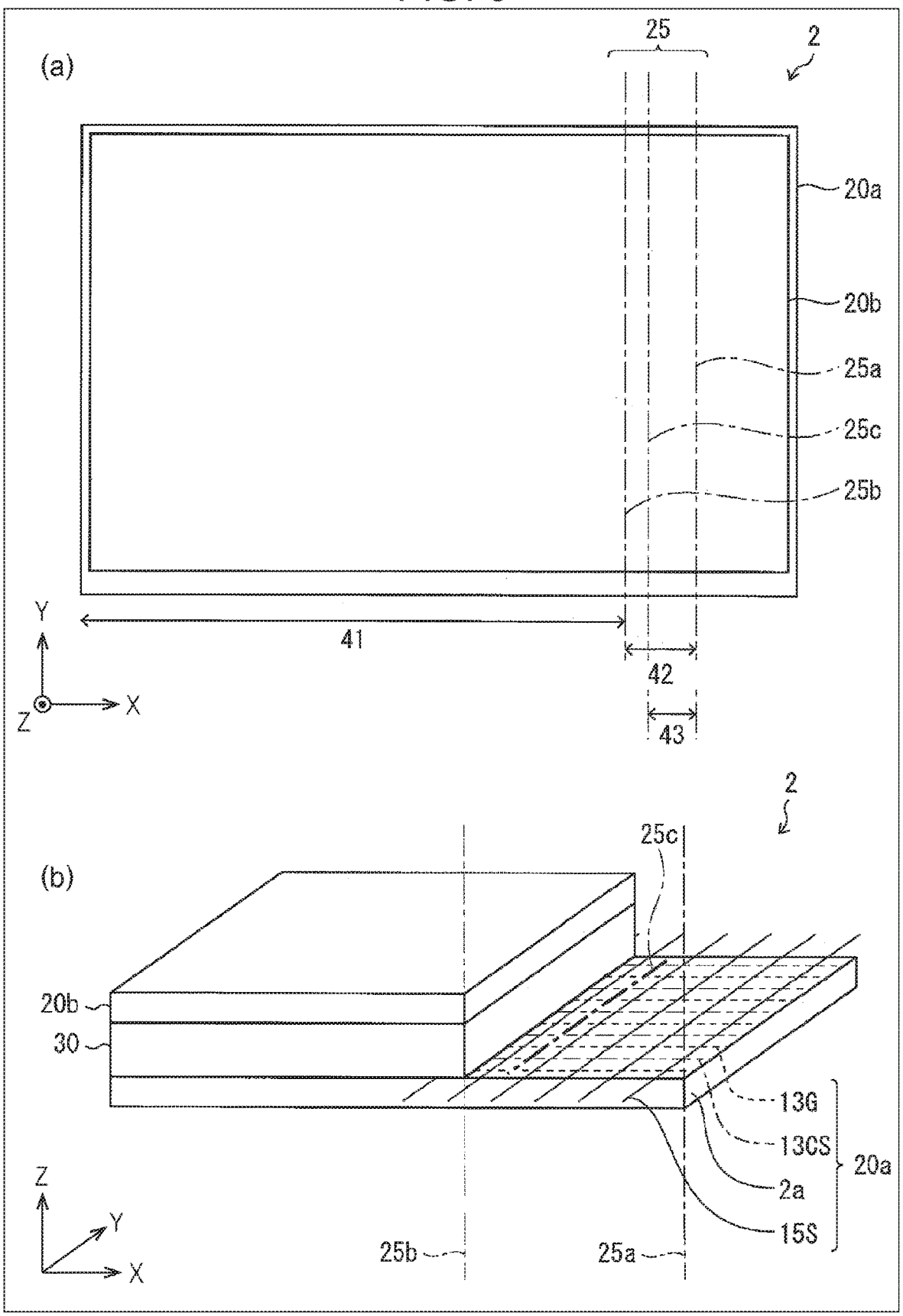
FIG. 3(a) is a top view depicting a schematic configuration of dividing lines along which a display panel is divided.
FIG. 3(b) is a perspective view depicting a schematic configuration of the vicinity of the dividing lines of the display panel after having been mechanically divided, according to several embodiments of the present disclosure.

FIG. 3 is a drawing for describing the dividing of the display panel 2 according to dividing lines 25.

(Dividing Lines)

FIG. 3(a) is a top view depicting a schematic configuration of the dividing lines 25 along which the display panel 2 is divided.

The dividing lines 25 include an active matrix substrate dividing line 25a along which the active matrix substrate 20a is mechanically divided, an opposite substrate dividing line 25b along which the opposite substrate 20b is mechanically divided, and a laser scanning line 25c along which the gate lines 13G and the auxiliary capacitance lines 13CS (and also the source lines 15S in some cases) on the active matrix substrate 20a are divided.

The active matrix substrate dividing line 25a, the opposite substrate dividing line 25b, and the laser scanning line 25c are substantially parallel with each other in the Y axis direction. The opposite substrate dividing line 25b is positioned at the side near the gate driver 11 (−X side), seen from the active matrix substrate dividing line 25a. It is preferable for the gap between the active matrix substrate dividing line 25a and the opposite substrate dividing line 25b to be 0.5 mm to 2 mm, although this depends on the extent to which the mechanical dividing of the active matrix substrate 20a affects the gate lines 13G and the auxiliary capacitance lines 13CS. Furthermore, the laser scanning line 25c is positioned between the active matrix substrate dividing line 25a and the opposite substrate dividing line 25b.

In the display panel 2 after having been divided along the dividing lines 25, a region 41 at the side (−X side) nearer the gate driver 11 than the opposite substrate dividing line 25b becomes a display region 41. Furthermore, a region 42 at the side (+X side) further from the gate driver 11 than the opposite substrate dividing line 25b becomes a non-display region 42. Furthermore, from within the non-display region 42, a region 43 that is electrically isolated from the display region 41 due to laser scanning along the laser scanning line 25c becomes an isolated region 43.

The isolated region 43 includes regions where a short circuit may occur due to mechanical dividing along the active matrix substrate dividing line 25a. Therefore, the display region 41 is isolated from the regions where a short circuit may have occurred, due to the laser scanning along the laser scanning line 25c. Consequently, it is preferable for the laser scanning line 25c to be sufficiently separated from the active matrix substrate dividing line 25a so that the isolated region 43 includes all regions where a short circuit may have occurred. Furthermore, in the present embodiment, although described in detail later, it is preferable for the laser light that is radiated along the laser scanning line 25c to be away from the source lines 15S so that the gate lines 13G do not short circuit to the source lines 15S, with consideration being given to the width of the source lines 15S and width of the laser light.

(Dividing Process)

FIG. 3(b) is a perspective view depicting a schematic configuration of the vicinity of the dividing lines 25 of the display panel 2 after having been mechanically divided. In FIG. 3(b), the source lines 15S are depicted as solid lines, the gate lines 13G are depicted as dotted lines, and the auxiliary capacitance lines 13CS are depicted as one-dot chain lines. Hereinafter, a process for dividing the display panel 2 will be described with reference to FIG. 3(b).

First, the active matrix substrate 20a is mechanically divided along the active matrix substrate dividing line 25a. At such time, the gate lines 13G and the auxiliary capacitance lines 13CS are also divided together with the insulating substrate 2a. The gate lines 13G and the auxiliary capacitance lines 13CS near the active matrix substrate dividing line 25a may have short-circuited or may short-circuit during use of the display panel 2 since a mechanical external force is applied.

Next, the opposite substrate 20b is likewise mechanically divided along the opposite substrate dividing line 25b. It should be noted that the dividing of the active matrix substrate 20a and the dividing of the opposite substrate 20b may be carried out one after the other or may be carried out at the same time.

A liquid crystal layer 30 that is exposed on the active matrix substrate 20a within the non-display region 42 is then removed. Wiring (gate lines 13G, auxiliary capacitance lines 13CS, and source lines 15S) on the insulating substrate 2a within the non-display region 42 is thereby exposed. Due to this exposure, it becomes easy to radiate a scanning laser in the next step.

Next, a laser is scanned on the surface of the active matrix substrate 20a along the laser scanning line 25c. Due to the laser scanning, wiring (gate lines 13G, auxiliary capacitance lines 13CS, and source lines 15S) within the laser irradiated region is evaporated and removed. As a result, wiring at the side nearer the active matrix substrate dividing line 25a than the laser irradiated region (+X direction) is isolated from wiring at the side nearer the gate driver 11 (−X direction).

After carrying out dividing such as the aforementioned, the liquid crystal layer 30 within the display region 41 held between the active matrix substrate 20a and the opposite substrate 20b is sealed with a sealing material (in a case where the liquid crystal layer 30 is lacking, a liquid crystal composition that forms the liquid crystal layer 30 is injected prior to the sealing).

(Laser Scanning)

Figure 4:
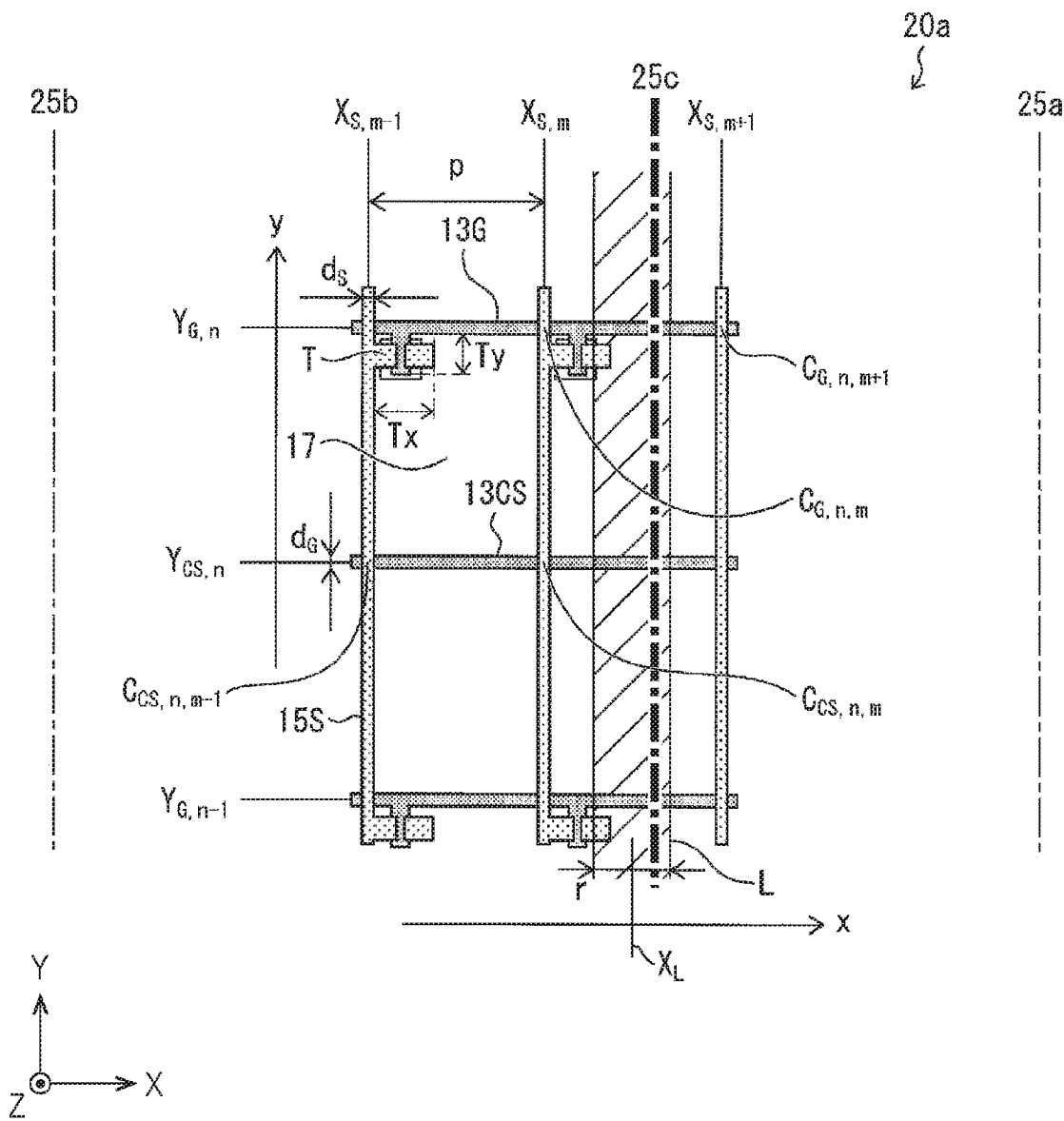
FIG. 4 is a top view depicting a schematic configuration of wiring near a laser scanning line of an active matrix substrate according to one embodiment of the present disclosure.

FIG. 4 is a top view depicting a schematic configuration of wiring near the laser scanning line 25c of the active matrix substrate 20a. It should be noted that, in FIG. 4, the insulating substrate 2a, pixel electrodes, insulating layers, and the like are omitted in order to aid understanding of the schematic structure of the wiring.

Switching elements T (first switching elements) for applying source signals in accordance with gate signals to the pixel electrodes are provided on the active matrix substrate 20a. The switching elements T are thin film transistors (TFTs), for example, and are provided corresponding to intersections between the gate lines 13G and the source lines 15S.

As depicted in FIG. 4, when laser light having a width r is radiated along the laser scanning line 25c, an irradiated region L having the width r along the laser scanning line 25c is generated, and the portion of the wiring (gate lines 13G, auxiliary capacitance lines 13CS, and source lines 15S) inside the irradiated region L is evaporated and removed. Meanwhile, at the boundary sections between the irradiated region L and non-irradiated regions, the material forming the wiring melts and remains without evaporating. The gate lines 13G, the auxiliary capacitance lines 13CS, and the source lines 15S are laminated with an insulating layer interposed, and therefore, due to the melting, the gate lines 13G and the source lines 15S may short-circuit at the intersections between the gate lines 13G and the source lines 15S. Similarly, due to the melting, the auxiliary capacitance lines 13CS and the source lines 15S may short-circuit at intersections between the auxiliary capacitance lines 13CS and the source lines 15S. Therefore, in a case where the boundary section nearer the gate driver 11 (−X side) out of the boundary sections between the irradiated region L and the non-irradiated regions superposes an intersection $C_{G,n,m}$ where the gate line 13G of an $n^{th}$ row (n being a natural number greater than or equal to 1 and less than or equal to N−1) from the source driver 3 and the source line 15S of an $m^{th}$ column (m being a natural number greater than or equal to 1 and less than or equal to M−1) from the gate driver 11 intersect, the gate line 13G and the source line 15S may short-circuit at the intersection $C_{G,n,m}$. Therefore, it is necessary for the laser light irradiated region L to satisfy the relationship of expression (1) below.

$$X_{S,m}+d_S/2<X_L-r/2<X_{S,m+1}-d_S/2 \quad (1)$$

In which, $X_{S,m}$ is the X coordinate of the center line of the source line 15S of the $m^{th}$ column from the gate driver 11, $X_L$ is the X coordinate of the center line of the irradiated region L, $d_S$ is the width of the source line 15S, and r is the width of the laser light radiated along the laser scanning line 25c and the width of the irradiated region L.

Furthermore, conversely, in a case where the laser light irradiated region L does not satisfy the relationship of expression (1), in other words, in a case where the relationship of expression (2) below is satisfied, the gate line 13G and the source line 15S may short-circuit at the intersection $C_{G,n,m}$.

$$X_{S,m}-d_S/2 \leq X_L-r/2 \leq X_{S,m}+d_S/2 \quad (2)$$

Also, $p=X_{S,m+1}-X_{S,m}$ when a sub-pixel pitch is taken as p, and therefore the laser light position tolerance is $\pm(p-d_S)/2$.

Consequently, with regard to position tolerance, which is the difference between the X coordinate of the center line of the irradiated region L and the X coordinate of the laser scanning line 25c, it is necessary for the position tolerance for the radiation of laser light along the laser scanning line 25c to be less than $\pm(p-d_S)/2$, and is preferably even smaller. Furthermore, it is preferable for the laser scanning line 25c to be away from the source lines 15S.

Effects

In the invention described in the aforementioned PTL 1, there is a problem in that there is a possibility of a repaired short circuit reoccurring during the use, operation lifetime, and so forth of a display panel, and of a weak portion that has not short-circuited then short-circuiting immediately after the display panel is divided. With respect to this problem, in the invention described in the aforementioned PTL 1, additional stress testing is carried out, and weak portions that may short-circuit during use, the operation lifetime, and so forth are exposed.

However, in the dividing of the display panel 2 including the active matrix substrate 20a according to the present embodiment of the present disclosure, the isolated region 43 that includes regions where a short circuit may occur is electrically isolated from the display region 41 due to laser light being radiated along the laser scanning line 25c. Therefore, short-circuiting caused by the dividing has no bearing on the display region 41, and display defects caused by short-circuiting due to the dividing are not generated therein.

Embodiment 2

Another embodiment of the present disclosure is as follows when described on the basis of FIGS. 1, 5, 6, and 7. It should be noted that, for convenience of the description, members having the same functions as the members described in the aforementioned embodiment are denoted by the same reference signs and descriptions thereof are omitted.

(Configuration of Liquid Crystal Display Device and Active Matrix Substrate)

FIG. 1 is a top view depicting a schematic configuration of a liquid crystal display device according to the present embodiment.

A liquid crystal display device 1 is provided with a display panel 2, a source driver 3, a gate driver 11, a display control circuit 4, and a power source 5. The display panel 2 is provided with an active matrix substrate 20a, an opposite substrate 20b, and a liquid crystal layer (not depicted) held between these substrates.

Figure 5:
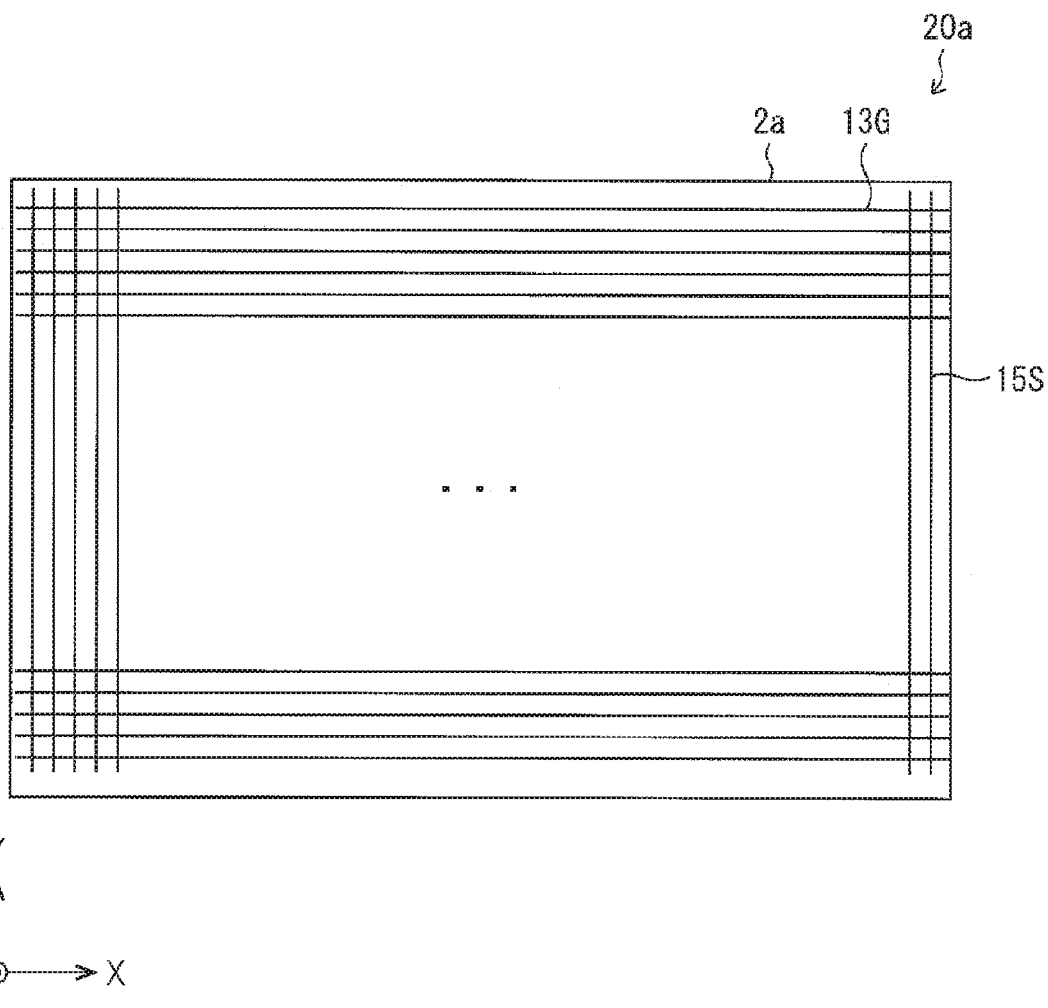
FIG. 5 is a top view depicting a schematic configuration of an active matrix substrate according to one embodiment of the present disclosure.

FIG. 5 is a top view depicting a schematic configuration of the active matrix substrate 20a.

The active matrix substrate 20a includes an insulating substrate 2a such as a glass substrate, and N gate lines 13G, N auxiliary capacitance lines 13CS, and M source lines 15S that are formed on the insulating substrate 2a (N and M are natural numbers that are greater than or equal to 2).

(Wiring Detour)

Figure 6:
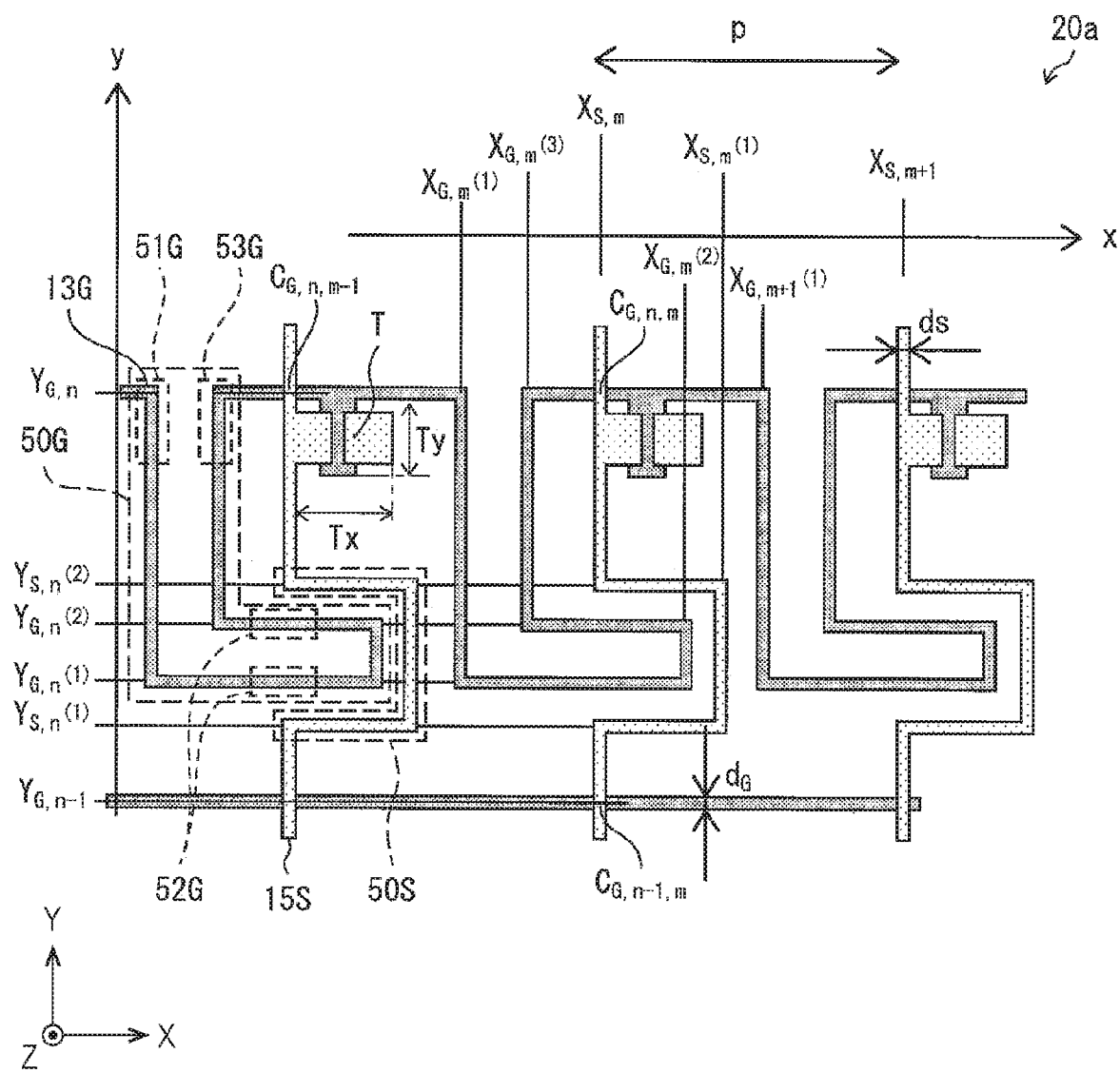
FIG. 6 is a top view depicting a schematic configuration of an active matrix substrate, for depicting one working example of gate line detour sections and source line detour sections according to one embodiment of the present disclosure.
Figure 7:
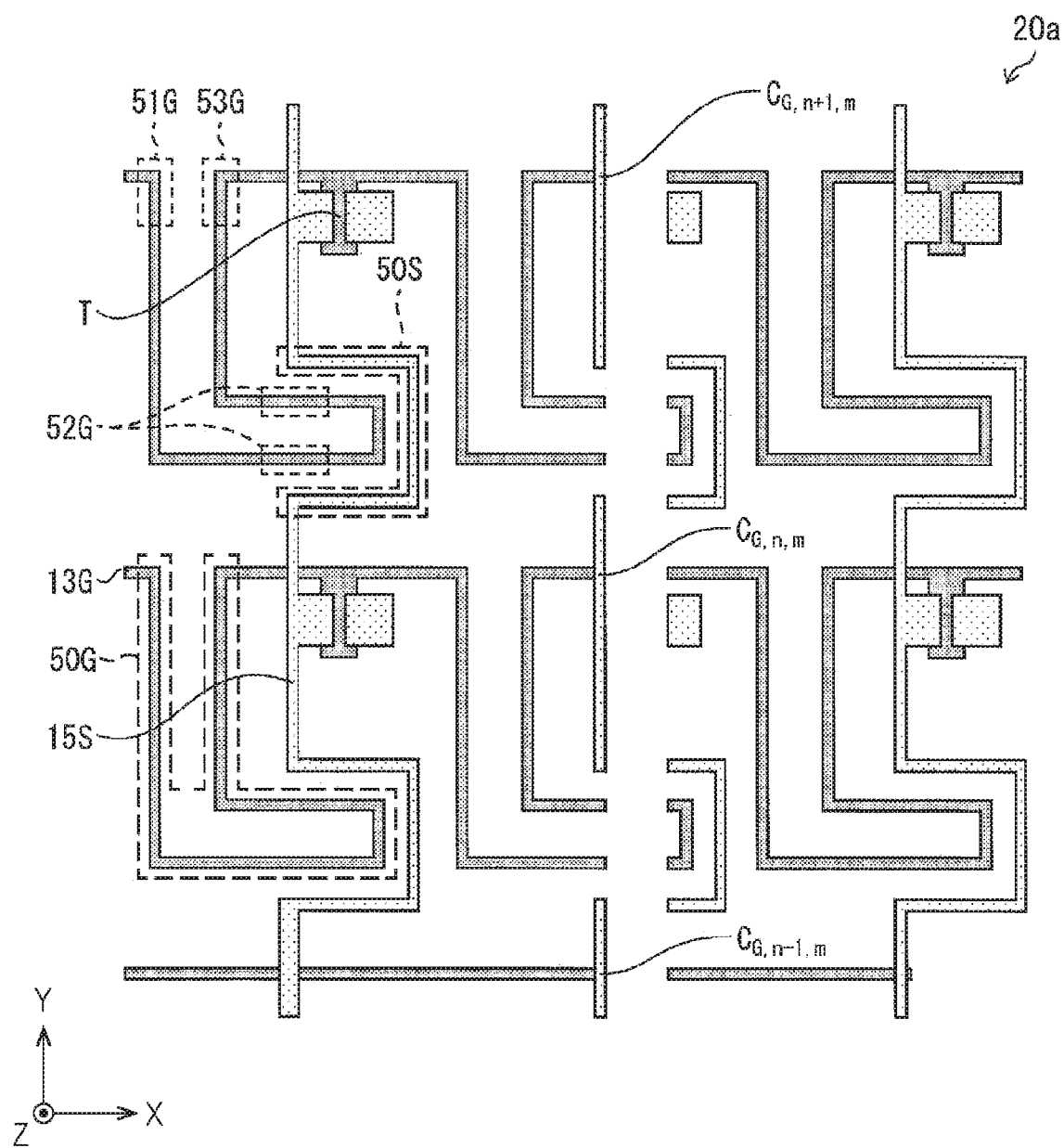
FIG. 7 is a top view depicting a schematic configuration of the active matrix substrate, in a case where a boundary section at the −X direction side of a laser light irradiated region L superposes a source line, in the working example depicted in FIG. 6.

In the present embodiment, different from the aforementioned embodiment 1, gate line detour sections 50G are provided in each gate line 13G and source line detour sections 50S (source line first detour sections) are provided in each source line 15S, as in FIGS. 6 and 7, although not depicted in FIG. 5.

The gate line detour sections 50G are provided corresponding to intersections between the gate lines 13G and the source lines 15S. The gate line detour sections 50G are portions formed in such a way that the gate lines 13G detour so that (i) gate lines 13G extending from the −X direction end of the active matrix substrate 20a prior to passing through corresponding intersections are divided at the irradiated region L in a case where the laser light irradiated region L satisfies the relationship of expression (2), and so that (ii) intersections where the gate lines 13G intersect (themselves or other wiring, including being superposed in parallel) are not newly made (in other words, are not increased). This is because, in a case where there is an increase in intersections in the gate lines 13G, those intersections may short-circuit when the boundary sections of the irradiated region L superpose those intersections.

The source line detour sections 50S are provided corresponding to the gate line detour sections 50G. The source line detour sections 50S are portions formed in such a way that the source lines 15S avoid the corresponding gate line detour sections 50G so that intersections where the source lines 15S intersect (themselves or other wiring) are not newly made.

The gate line detour sections 50G do not cause an increase in intersections, as previously mentioned. Therefore, the gate lines 13G intersect the source lines 15S only at intersections (first intersections) where the gate line detour sections 50G are provided in a corresponding manner. Furthermore, the gate lines 13G do not intersect themselves and do not intersect other adjacent gate lines 13G. As a result, the gate lines 13G start detouring with the gate lines 13G bending from a start position (first start position) between a corresponding intersection and another intersection adjacent at the −X direction side to the corresponding intersection (in the −X direction relative to the corresponding intersection), toward the −Y direction or the +Y direction. Similarly, when the gate lines 13G stop detouring, the gate lines 13G return from the −Y direction or the +Y direction to an end position (first end position) between the corresponding intersection and the start position (in the −X direction relative to the corresponding intersection, and in the +X direction relative to the start position). The gate lines 13G having finished detouring then bend toward the +X direction and pass through the corresponding intersection.

The gate line detour sections 50G are divided at the irradiated region L in a case where the laser light irradiated region L satisfies the relationship of expression (2). Therefore, the gate lines 13G of the gate line detour sections 50G straddle both a straight line (first straight line) that passes through the +X direction end of the corresponding intersection and extends in the Y axis direction (+Y direction and −Y direction) and a straight line that passes through the −X direction end and extends in the Y axis direction. However, as previously mentioned, the gate line detour sections 50G start from a start position that is in the −X direction relative to the corresponding intersection and finish at an end position that is in the −X direction relative to the corresponding intersection, and therefore the gate lines 13G of the gate line detour sections 50G also straddle a straight line that passes through the −X direction end when straddling a straight line that passes through the +X direction end.

Due to such gate line detour sections 50G, with reference to FIGS. 4 and 7 in a case where the laser light irradiated region L satisfies the relationship of expression (2), gate signals that are supplied from the gate driver 11 to the gate lines 13G reach the immediately preceding intersection $C_{G,n,m-1}$, are then interrupted at the gate line detour sections 50G, and do not reach the intersection $C_{G,n,m}$, which may have short-circuited.

Consequently, with reference to FIG. 6, the gate line detour sections 50G include: (i) a start section 51G (first start section) in which the gate line 13G is drawn out in the +Y direction or the −Y direction from a start position that is in the −X direction relative to the corresponding intersection; (ii) straddling sections 52G (first straddling sections) in which the gate line 13G straddles a straight line that passes through the +X direction end of the corresponding intersection and extends in the Y axis direction; and (iii) an end section 53G (first end section) in which the gate line 13G returns from an end position that is in the −X direction relative to the corresponding intersection and in the +X direction relative to the start position. The gate line 13G electrically connects: (i) between the end position of the gate line detour section 50G and the corresponding intersection by means of a portion of the gate line 13G that is not the gate line detour section 50G; (ii) between the start position of the gate line detour section 50G and another intersection adjacent at the −X direction side to the corresponding intersection by means of a portion of the gate line 13G that is not the gate line detour section 50G; and (iii) between the start position and the end position of the same gate line detour section 50G by means of only a portion of the gate line 13G that is the gate line detour section 50G. It is preferable for the gate lines 13G of the gate line detour sections 50G and the source lines 15S of the source line detour sections 50S to be formed so as to pass through positions that are different from the switching elements T in order to avoid the switching elements T.

Working Example

FIG. 6 is a top view depicting a schematic configuration of the active matrix substrate 20a, for depicting one working example of the gate line detour sections 50G and the source line detour sections 50S in the present embodiment.

Hereinafter, a detailed description will be given with reference to FIG. 6 of a working example in which the gate lines 13G are bent in a linear and simple manner to thereby form the gate line detour sections 50G, and the source lines 15S are bent in a linear and simple manner to thereby form the source line detour sections 50S. However, the examples depicted in FIGS. 6 to 10 are for deepening understanding of the gate line detour sections 50G and the source line detour sections 50S, and do not restrict the present disclosure. The gate line detour sections 50G and the source line detour sections 50S may be formed in any complex manner so as to branch in a curved manner, bend a large number of times, and so forth.

Hereinafter, M is a natural number that is greater than or equal to 2, m is a natural number that is greater than or equal to 1 and less than or equal to M−1, N is a natural number that is greater than or equal to 2, and n is a natural number that is greater than or equal to 1 and less than or equal to N−1. Furthermore, the widths of the switching elements T in the X axis direction and the Y axis direction are taken as $T_X$ and $T_Y$. Furthermore, although a gate line 13G of the 0th row and a source line 15S of the $0^{th}$ column do not actually exist, for convenience, it is assumed that the gate line 13G of the 0th row extends along the −Y side end of the active matrix substrate and the source line 15S of the $0^{th}$ column extends along the −X side end of the active matrix substrate.

Hereinafter, the magnitude relationship of the X coordinates and the magnitude relationship of the Y coordinates will be examined with regard to the intersection $C_{G,n,m}$ where the source line 15S of the $m^{th}$ column from the gate driver 11 and the gate line 13G of the $n^{th}$ row from the source driver 3 intersect, the gate line detour section 50G of the gate line 13G corresponding to the intersection $C_{G,n,m}$, and the source line detour section 50S of the source line 15S corresponding to the gate line detour section 50G.

In FIG. 6, the gate line 13G of the $n^{th}$ row from the source driver 3
passes through the intersection $C_{G,n,m-1}$ in the +X direction,
turns in the −Y direction at $X_{G,m}^{(1)}$,
turns in the +X direction at $Y_{G,n}^{(1)}$,
turns in the +Y direction at $X_{G,m}^{(2)}$,
turns in the −X direction at $Y_{G,n}^{(2)}$,
turns in the +Y direction at $X_{G,m}^{(3)}$,
turns in the +X direction at $Y_{G,n}$, and
passes through the intersection $C_{G,n,m}$ in the +X direction.

In FIG. 6, the source line 15S of the $m^{th}$ column from the gate driver 11
passes through the intersection $C_{G,n-1,m}$ in the +Y direction,
turns in the +X direction at $Y_{S,n}^{(1)}$,
turns in the +Y direction at $X_{S,m}^{(1)}$,
turns in the −X direction at $Y_{S,n}^{(2)}$,
turns in the +Y direction at $X_{S,m}$, and
passes through the intersection $C_{G,n,m}$ in the +Y direction.
It should be noted that
the coordinates of the central point of the intersection $C_{G,n,m}$ are $(X_{S,m}, Y_{G,n})$,
the coordinates of the central point of the intersection $C_{G,n-1,m}$ are $(X_{S,m}, Y_{G,n-1})$,
the coordinates of the central point of the intersection $C_{G,n,m-1}$ are $(X_{S,m-1}, Y_{G,n})$,
X coordinates or Y coordinates of center lines of the gate line 13G are respectively $Y_{G,n}$, $X_{G,m}^{(1)}$, $Y_{G,n}^{(1)}$, $X_{G,m}^{(2)}$, $Y_{G,n}^{(2)}$, and $X_{G,m}^{(3)}$, and
X coordinates or Y coordinates of center lines of the source line 15S are respectively $X_{S,m}$, $Y_{S,n}^{(1)}$, $X_{S,m}^{(1)}$, and $Y_{S,n}^{(2)}$.

Then, on the basis of (i) the positional relationship of the start section 51G, the straddling sections 52G, and the end section 53G provided in the gate line detour sections 50G to each other, with respect to the intersection $C_{G,n,m}$, the intersection $C_{G,n-1,m}$, and the intersection $C_{G,n,m-1}$, and it being preferable for (ii) the source line detour sections 50S to be provided so as to avoid the gate line detour sections 50G and (iii) the gate lines 13G of the gate line detour sections 50G and the source lines 15S of the source line detour sections 50S to not superpose the switching elements T, if a width $d_G$ of the gate lines 13G and a width $d_S$ of the source lines 15S are not taken into consideration, the gate line detour section 50G corresponding to the intersection $C_{G,n,m}$ and the source line detour section 50S corresponding to that gate line detour section 50G satisfy the relationships of expression (3) and expression (4) below.

$$X_{S,m-1}+T_X<X_{G,m}^{(1)}<X_{G,m}^{(3)}<X_{S,m}<X_{G,m}^{(2)}<X_{S,m}^{(1)}<X_{G,m+1}^{(1)} \quad (3)$$

$$Y_{G,n-1}<Y_{S,n}^{(1)}<Y_{G,n}^{(1)}<Y_{G,n}^{(2)}<Y_{S,n}^{(2)}<Y_{G,n}-T_Y \quad (4)$$

In addition, if the width $d_G$ of the gate lines 13G and the width $d_S$ of the source lines 15S are taken into consideration, it is derived based on the relationship of expression (3) that the gate line detour sections 50G and the source line detour sections 50S satisfy the relationships of expressions (5-1) to (5-6) below. Similarly, it is derived based on the relationship of expression (4) that the relationships of expressions (6-1) to (6-5) below are satisfied.

$$X_{S,m-1}+d_S/2+T_X+d_G/2<X_{G,m}^{(1)} \quad (5\text{-}1)$$

$$X_{G,n}^{(1)}+d_G<X_{G,m}^{(3)} \quad (5\text{-}2)$$

$$X_{G,m}^{(3)}+d_G/2+d_S/2<X_{S,m} \quad (5\text{-}3)$$

$$X_{S,m}+d_S/2+d_G/2<X_{G,m}^{(2)} \quad (5\text{-}4)$$

$$X_{G,m}^{(2)}+d_G/2+d_S/2<X_{S,m}^{(1)} \quad (5\text{-}5)$$

$$X_{S,m}^{(1)}+d_S/2+d_G/2<X_{G,m+1}^{(1)} \quad (5\text{-}6)$$

$$Y_{G,n-1}+d_G/2+d_S/2<Y_{S,n}^{(1)} \quad (6\text{-}1)$$

$$Y_{S,n}^{(1)}+d_S/2+d_G/2<Y_{G,n}^{(1)} \quad (6\text{-}2)$$

$$Y_{G,n}^{(1)}+d_G<Y_{G,n}^{(2)} \quad (6\text{-}3)$$

$$Y_{G,n}^{(2)}+d_G/2+d_S/2<Y_{S,n}^{(2)} \quad (6\text{-}4)$$

$$Y_{S,n}^{(2)}+d_S/2+d_G/2<Y_{G,n}-T_Y \quad (6\text{-}5)$$

FIG. 7 is a top view depicting a schematic configuration in a case where the laser light irradiated region L satisfies the relationship of expression (2), in the working example depicted in FIG. 6.

As depicted in FIG. 7, in a case where the laser light irradiated region L satisfies the relationship of expression (2), a gate line 13G is divided between the intersection $C_{G,n,m-1}$ and reaching the intersection $C_{G,n,m}$, specifically, in the gate line detour section 50G corresponding to the intersection $C_{G,n,m}$, and more specifically, in the straddling sections 52G of that gate line detour section 50G. At the same time, the source line detour section 50S corresponding to the gate line detour section 50G in which the gate line 13G is divided is also divided. Consequently, a gate signal transmitted from the −X direction toward the +X direction by the gate line 13G of the $n^{th}$ row reaches the intersection $C_{G,n,m-1}$, is then interrupted at the gate line detour section 50G corresponding to the intersection $C_{G,n,m}$, and does not reach the intersection $C_{G,n,m}$.

Effects

According to the present embodiment, the isolated region 43 that includes regions where a short circuit may have occurred due to the mechanical dividing of the display panel 2 can be electrically isolated from the display region 41 by radiating laser light along the laser scanning line 25c. Therefore, an effect is demonstrated in that short circuits and display defects caused by the short circuits are reliably removed from the display region 41 of the display panel 2 after having been divided.

In addition, as depicted in FIG. 7, different from the aforementioned embodiment 1, according to the present embodiment, in a case where the laser light irradiated region L satisfies the relationship of expression (2), the intersection $C_{G,n,m}$, which may short-circuit, is electrically isolated from the display region 41 (FIG. 3). Therefore, the laser light irradiated region L may not satisfy the relationship of expression (1). Consequently, it is possible for the laser scanning line 25c to be near or superposing a source line 15S. Furthermore, the position tolerance of the laser light may be greater than $\pm(p-d_S)/2$.

In this way, since the laser light irradiated region L may not satisfy the relationship of expression (1), it is possible to more easily realize a display panel in which display defects do not occur due to short circuits caused by dividing.

Embodiment 3

Another embodiment of the present disclosure is as follows when described on the basis of FIGS. 1, 2, and 8. It should be noted that, for convenience of the description, members having the same functions as the members described in the aforementioned embodiment are denoted by the same reference signs and descriptions thereof are omitted.

(Configuration of Liquid Crystal Display Device and Active Matrix Substrate)

FIG. 1 is a top view depicting a schematic configuration of a liquid crystal display device according to the present embodiment.

A liquid crystal display device 1 is provided with a display panel 2, a source driver 3, a gate driver 11, a display control circuit 4, and a power source 5. The display panel 2 is provided with an active matrix substrate 20a, an opposite substrate 20b, and a liquid crystal layer (not depicted) held between these substrates.

FIG. 2 is a top view depicting a schematic configuration of the active matrix substrate 20a.

The active matrix substrate 20a includes an insulating substrate 2a such as a glass substrate, and N gate lines 13G, N auxiliary capacitance lines 13CS, and M source lines 15S formed on the insulating substrate 2a.

In the present embodiment, different from the aforementioned embodiment 2 but similar to the aforementioned embodiment 1, the active matrix substrate 20a includes the auxiliary capacitance lines 13CS.

(Wiring Detour)

In the present embodiment, similar to the aforementioned embodiment 2, gate line detour sections 50G and source line detour sections 50S are provided. Also, due to the presence of the auxiliary capacitance lines 13CS, which are wiring other than the gate lines 13G and the source lines 15S, the gate line detour sections 50G and the source line detour sections 50S are formed so as to not intersect the auxiliary capacitance lines 13CS.

Working Example

Figure 8:
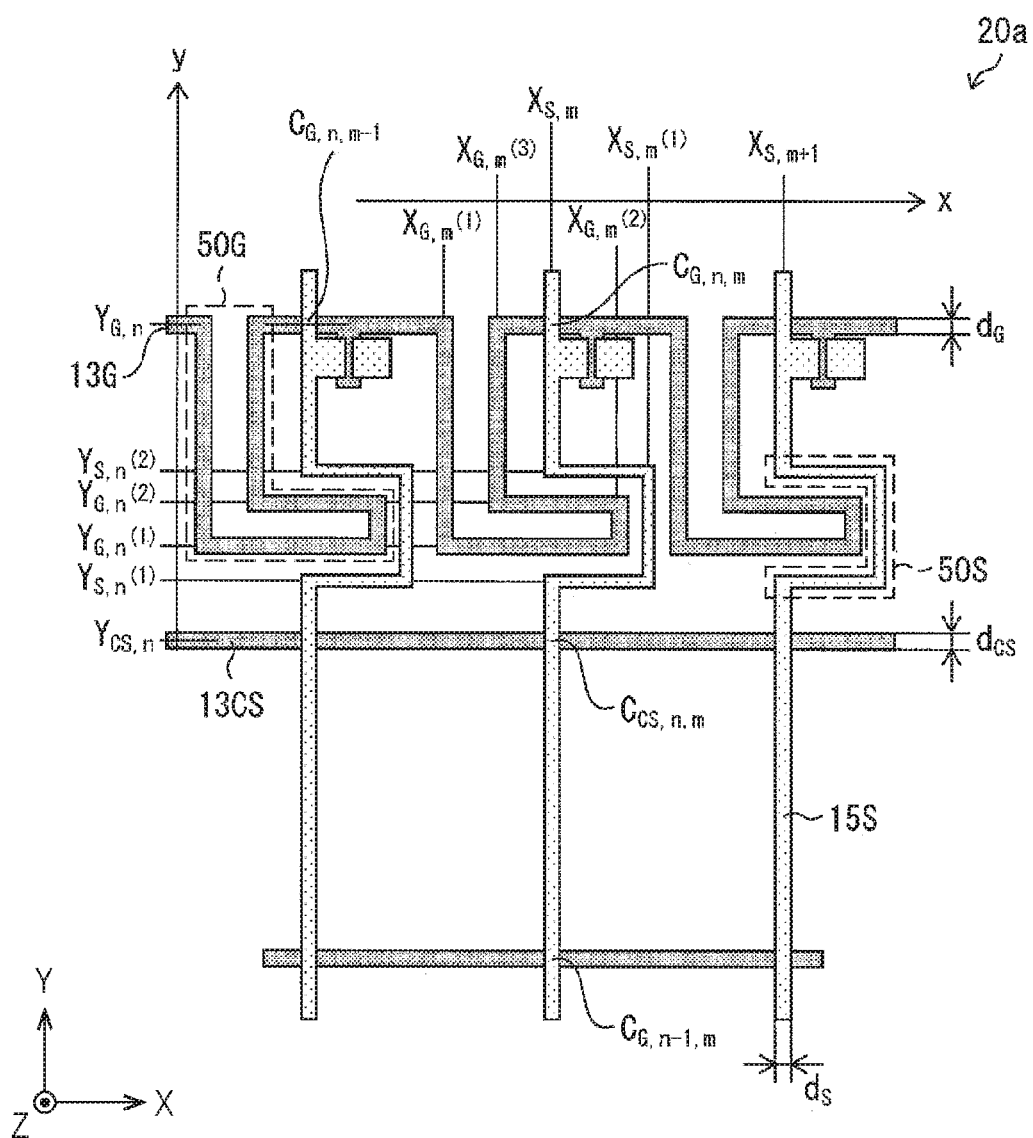
FIG. 8 is a top view depicting a schematic configuration of an active matrix substrate, for depicting one working example of gate line detour sections and source line detour sections according to one embodiment of the present disclosure.

FIG. 8 is a top view depicting a schematic configuration of the active matrix substrate 20a, for depicting one working example of the gate line detour sections 50G and the source line detour sections 50S in the present embodiment.

In FIG. 8, the gate line 13G of the $n^{th}$ row from the source driver 3 and the source line 15S of the $m^{th}$ column from the gate driver 11 are bent in a similar manner to the aforementioned embodiment 2. Furthermore, in FIG. 8, the auxiliary capacitance line 13CS of the $n^{th}$ row from the source driver 3 extends in the +X direction at $Y_{CS,n}$. Consequently, similar to the aforementioned embodiment 2, if the width $d_G$ of the gate lines 13G, the width $d_S$ of the source lines 15S, and a width $d_{CS}$ of the auxiliary capacitance lines 13CS are not taken into consideration, the gate line detour section 50G corresponding to the intersection $C_{G,n,m}$ and the source line detour section 50S corresponding to that gate line detour section 50G satisfy the relationship of the aforementioned expression (3) and the relationship of expression (7) or (8) below.

$$Y_{G,n-1}<Y_{S,n}^{(1)}<Y_{CS,n}<Y_{G,n}^{(1)}<Y_{G,n}^{(2)}<Y_{S,n}^{(2)}<Y_{G,n}-T_Y \quad (7)$$

$$Y_{G,n-1}<Y_{CS,n}<Y_{S,n}^{(1)}<Y_{G,n}^{(1)}<Y_{G,n}^{(2)}<Y_{S,n}^{(2)}<Y_{G,n}-T_Y \quad (8)$$

The expressions (7) and (8) are conditional expressions with which the gate line detour section 50G and the source line detour section 50S are classified so as to not intersect the auxiliary capacitance line 13CS. Expression (7) is established in a case where $Y_{S,n}^{(1)}$ where the source line 15S of the m$^{th}$ column turns in the +X direction is in a position (−Y side) that is nearer to the source driver 3 than the auxiliary capacitance line 13CS of the n$^{th}$ row. Furthermore, expression (8) is established in a case where $Y_{S,n}^{(1)}$ where the source line 15S of the m$^{th}$ column turns in the +X direction is in a position (+Y side) that is further from the source driver 3 than the auxiliary capacitance line 13CS of the n$^{th}$ row.

In addition, if the width do of the gate lines 13G, the width $d_S$ of the source lines 15S, and the width $d_{CS}$ of the auxiliary capacitance lines 13CS are taken into consideration, it is derived based on the relationship of expression (3) that the gate line detour sections 50G and the source line detour sections 50S satisfy the relationships of the aforementioned expressions (5-1) to (5-6). Similarly, in a case where the relationship of expression (7) is satisfied, it is derived based on the relationship of expression (7) that the relationships of expressions (9-1) and (9-2) below and the aforementioned expressions (6-3) to (6-5) are satisfied. Furthermore, in a case where the relationship of expression (8) is satisfied, it is derived based on the relationship of expression (8) that the relationships of expression (10) below and the aforementioned expressions (6-2) to (6-5) are satisfied.

$$Y_{G,n-1}+d_G/2+d_S/2<Y_{S,n}^{(1)}<Y_{CS,n}-d_S/2-d_{CS}/2 \quad (9\text{-}1)$$

$$Y_{CS,n}+d_{CS}/2+d_G/2<Y_{G,n}^{(1)} \quad (9\text{-}2)$$

$$Y_{CS,n}+d_{CS}/2+d_S/2<Y_{S,n}^{(1)} \quad (10)$$

Also in the working example depicted in FIG. 8, similar to the working examples depicted in FIGS. 6 and 7, in a case where the laser light irradiated region L satisfies the relationship of expression (2), the gate line 13G, specifically, is divided in the gate line detour section 50G corresponding to the intersection $C_{G,n,m}$.

Effects

According to the present embodiment, the isolated region 43 that includes regions where a short circuit may have occurred due to the mechanical dividing of the display panel 2 can be electrically isolated from the display region 41 by radiating laser light along the laser scanning line 25c. Therefore, an effect is demonstrated in that short circuits and display defects caused by the short circuits are reliably removed from the display region 41 of the display panel 2 after having been divided.

In addition, similar to the aforementioned embodiment 2, according to the present embodiment, in a case where the laser light irradiated region L satisfies the relationship of expression (2), the intersection $C_{G,n,m}$, which may short-circuit, is electrically isolated from the display region 41 (FIG. 3). Therefore, the laser light irradiated region L may not satisfy the relationship of expression (1).

Embodiment 4

Another embodiment of the present disclosure is as follows when described on the basis of FIGS. 1, 2, and 9. It should be noted that, for convenience of the description, members having the same functions as the members described in the aforementioned embodiment are denoted by the same reference signs and descriptions thereof are omitted.

(Configuration of Liquid Crystal Display Device and Active Matrix Substrate)

FIG. 1 is a top view depicting a schematic configuration of a liquid crystal display device according to the present embodiment.

A liquid crystal display device 1 is provided with a display panel 2, a source driver 3, a gate driver 11, a display control circuit 4, and a power source 5. The display panel 2 is provided with an active matrix substrate 20a, an opposite substrate 20b, and a liquid crystal layer (not depicted) held between these substrates.

FIG. 2 is a top view depicting a schematic configuration of the active matrix substrate 20a.

The active matrix substrate 20a includes an insulating substrate 2a such as a glass substrate, and N gate lines 13G, N auxiliary capacitance lines 13CS, and M source lines 15S formed on the insulating substrate 2a.

In the present embodiment, similar to the aforementioned embodiments 1 and 3, the active matrix substrate 20a includes the auxiliary capacitance lines 13CS.

(Wiring Detour)

In the present embodiment, similar to the aforementioned embodiments 2 and 3, gate line detour sections 50G and source line detour sections 50S (source line first detour sections) corresponding to the gate line detour section 50G are provided. In addition, in the present embodiment, auxiliary capacitance line detour sections 50CS are provided in each auxiliary capacitance line 13CS, and source line detour sections 50S (source line second detour sections) corresponding to the auxiliary capacitance line detour sections 50CS are provided in each source line 15S.

The auxiliary capacitance line detour sections 50CS are provided corresponding to intersections between the auxiliary capacitance lines 13CS and the source lines 15S, similar to the gate line detour sections 50G being provided corresponding to intersections between the gate lines 13G and the source lines 15S. The auxiliary capacitance line detour sections 50CS are portions formed in such a way that the auxiliary capacitance lines 13CS detour so that (i) auxiliary capacitance lines 13CS extending from the −X direction end of the active matrix substrate 20a prior to passing through corresponding intersections are divided at the irradiated region L in a case where the laser light irradiated region L satisfies the relationship of expression (2), and so that (ii) intersections where the auxiliary capacitance lines 13CS intersect (themselves or other wiring) are not newly made (in other words, are not increased).

The source line detour sections 50S are provided corresponding to the gate line detour sections 50G, and are also provided corresponding to the auxiliary capacitance line detour sections 50CS. The source line detour sections 50S corresponding to the auxiliary capacitance line detour sections 50CS are portions formed in such a way that the source lines 15S avoid the corresponding auxiliary capacitance line detour sections 50CS so that intersections where the source lines 15S intersect (themselves or other wiring) are not newly made.

The gate line detour sections 50G do not cause an increase in intersections, as previously mentioned. Therefore, the gate lines 13G intersect the source lines 15S only at intersections (first intersections) where the gate line detour sections 50G are provided in a corresponding manner.

Furthermore, the gate lines 13G do not intersect themselves and do not intersect adjacent auxiliary capacitance lines 13CS.

The auxiliary capacitance line detour sections 50CS do not cause an increase in intersections, as previously mentioned. Therefore, the auxiliary capacitance lines 13CS intersect the source lines 15S only at intersections (second intersections) where the auxiliary capacitance line detour sections 50CS are provided in a corresponding manner. Furthermore, the auxiliary capacitance lines 13CS do not intersect themselves and do not intersect adjacent gate lines 13G. As a result, the auxiliary capacitance lines 13CS start detouring with the auxiliary capacitance lines 13CS bending from a start position (second start position) between a corresponding intersection and another intersection adjacent at the −X direction side to the corresponding intersection (in the −X direction relative to the corresponding intersection), toward the −Y direction or the +Y direction. Similarly, when the auxiliary capacitance lines 13CS stop detouring, the auxiliary capacitance lines 13CS return from the −Y direction or the +Y direction to an end position (second end position) between the corresponding intersection and the start position (in the −X direction relative to the corresponding intersection, and in the +X direction relative to the start position). The auxiliary capacitance lines 13CS having finished detouring then bend toward the +X direction and pass through the corresponding intersection.

The auxiliary capacitance line detour sections 50CS are divided at the irradiated region L in a case where the laser light irradiated region L satisfies the relationship of expression (2). Therefore, the auxiliary capacitance lines 13CS of the auxiliary capacitance line detour sections 50CS straddle both a straight line (second straight line) that passes through the +X direction end of the corresponding intersection and extends in the Y axis direction (+Y direction and −Y direction) and a straight line that passes through the −X direction end and extends in the Y axis direction. However, as previously mentioned, the auxiliary capacitance line detour sections 50CS start from a start position that is in the −X direction relative to the corresponding intersection, and finish at an end position that is in the −X direction relative to the corresponding intersection, and therefore the auxiliary capacitance lines 13CS of the auxiliary capacitance line detour sections 50CS also straddle a straight line that passes through the −X direction end when straddling a straight line that passes through the +X direction end.

Figure 9:
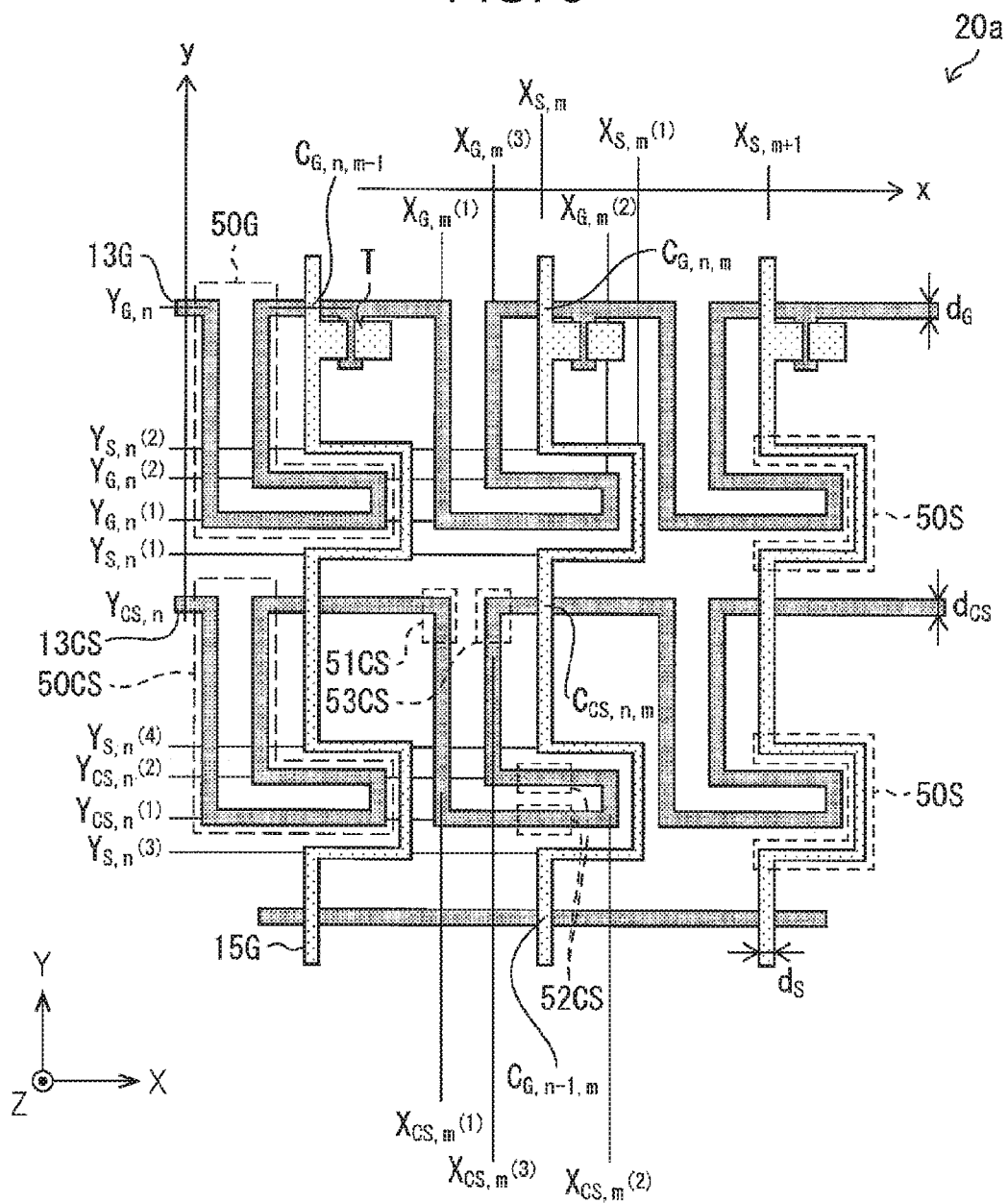
FIG. 9 is a top view depicting a schematic configuration of an active matrix substrate, for depicting one working example of gate line detour sections and source line detour sections according to one embodiment of the present disclosure.

Due to the auxiliary capacitance line detour sections 50CS, with reference to FIGS. 4 and 9 in a case where the laser light irradiated region L satisfies the relationship of expression (2), auxiliary capacitance signals transmitted by the auxiliary capacitance lines 13CS reach the immediately preceding intersection $C_{CS,n,m-1}$, are then interrupted at the auxiliary capacitance line detour sections 50CS, and do not reach the intersection $C_{CS,n,m}$, which may have short-circuited.

Consequently, with reference to FIG. 9, the auxiliary capacitance line detour sections 50CS include: (i) a start section 51CS (second start section) in which the auxiliary capacitance line 13CS is drawn out in the +Y direction or the −Y direction from a start position that is in the −X direction relative to the corresponding intersection; (ii) straddling sections 52CS (second straddling sections) in which the auxiliary capacitance line 13CS straddles a straight line that passes through the +X direction of the corresponding intersection and extends in the Y axis direction; and (iii) an end section 53CS (second end section) in which the auxiliary capacitance line 13CS returns from an end position that is in the −X direction relative to the corresponding intersection and in the +X direction relative to the start position. The auxiliary capacitance line 13CS electrically connects: (i) between the end position of the auxiliary capacitance line detour section 50CS and the corresponding intersection by means of a portion of the auxiliary capacitance line 13CS that is not the auxiliary capacitance line detour section 50CS; (ii) between the start position of the auxiliary capacitance line detour section 50CS and another intersection adjacent at the −X direction side to the corresponding intersection by means of a portion of the auxiliary capacitance line 13CS that is not the auxiliary capacitance line detour section 50CS; and (iii) between the start position and end position of the same auxiliary capacitance line detour section 50CS by means of only a portion of the auxiliary capacitance line 13CS that is the auxiliary capacitance line detour section 50CS. It is preferable for the auxiliary capacitance lines 13CS of the auxiliary capacitance line detour sections 50CS and the source lines 15S of the source line detour sections 50S to be formed so as to pass through positions that are different from the switching elements T in order to avoid the switching elements T.

Working Example

FIG. 9 is a top view depicting a schematic configuration of the active matrix substrate 20a, for depicting one working example of the gate line detour sections 50G and the source line detour sections 50S in the present embodiment.

In FIG. 9, the gate line 13G of the $n^{th}$ row from the source driver 3 is bent in a similar manner to the aforementioned embodiment 2.

In FIG. 9, the source line 15S of the $m^{th}$ column from the gate driver 11 is bent in a similar manner to the aforementioned embodiment 2, and, in addition,
  turns in the +X direction at $Y_{S,n}^{(3)}$,
  turns in the +Y direction at $X_{S,m}^{(1)}$,
  turns in the −X direction at $Y_{S,n}^{(4)}$,
  turns in the +Y direction at $X_{S,m}$, and
  passes through the intersection $C_{CS,n,m}$.

In FIG. 9, the auxiliary capacitance line 13CS of the $n^{th}$ row from the source driver 3
  passes through the intersection $C_{CS,n,m-1}$ in the +X direction,
  turns in the −Y direction at $X_{CS,m}^{(1)}$,
  turns in the +X direction at $Y_{CS,n}^{(1)}$,
  turns in the +Y direction at $X_{CS,m}^{(2)}$,
  turns in the −X direction at $Y_{CS,n}^{(2)}$,
  turns in the +Y direction at $X_{CS,m}^{(3)}$,
  turns in the +X direction at $Y_{CS,n}$, and
  passes through the intersection $C_{CS,n,m}$, in the +X direction.

It should be noted that
  the central coordinates of the intersection $C_{CS,n,m}$ are $(X_{CS,m}, Y_{CS,n})$,
  the central coordinates of the intersection $C_{CS,n,m-1}$ are $(X_{CS,m-1}, Y_{CS,n})$,
  X coordinates or Y coordinates of center lines of the auxiliary capacitance line 13CS are respectively $Y_{CS,n}$, $X_{CS,m}^{(1)}$, $Y_{CS,n}^{(1)}$, $X_{CS,m}^{(2)}$, $Y_{CS,n}^{(2)}$, and $X_{CS,m}^{(3)}$, and
  X coordinates or Y coordinates of center lines of the source line 15S are respectively $Y_{S,n}^{(3)}$, $X_{S,m}^{(2)}$, and $Y_{S,n}^{(4)}$.

Then, on the basis of (i) the positional relationship of the start section 51G, the straddling sections 52G, and the end section 53G provided in the gate line detour sections 50G to each other, with respect to the intersection $C_{G,n,m}$, the intersection $C_{CS,n,m}$, and the intersection $C_{G,n,m-1}$, (ii) the positional relationship of the start section 51CS, the straddling sections 52CS, and the end section 53CS provided in the auxiliary capacitance line detour sections 50CS to each other, with respect to the intersection $C_{CS,n,m}$, the intersection $C_{G,n-1,m}$, and the intersection $C_{CS,n,m-1}$, and it being preferable for (iii) the source line detour sections 50S to be provided so as to avoid the gate line detour sections 50G and the auxiliary capacitance line detour sections 50CS, and (iv) the gate lines 13G of the gate line detour sections 50G, the source lines 15S of the source line detour sections 50S, and the auxiliary capacitance lines 13CS of the auxiliary capacitance line detour sections 50CS to not superpose the switching elements T, if the width dc of the gate lines 13G, the width $d_S$ of the source lines 15S, and the width $d_{CS}$ of the auxiliary capacitance lines 13CS are not taken into consideration, the gate line detour section 50G corresponding to the intersection $C_{G,n,m}$, the auxiliary capacitance line detour section 50CS corresponding to the intersection $C_{CS,n,m}$, and the source line detour section 50S corresponding to that gate line detour section 50G and auxiliary capacitance line detour section 50CS satisfy the relationships of expression (3) and expressions (11) and (12) below.

$$X_{S,m-1}+T_X<X_{CS,m}^{(1)}<X_{CS,m}^{(3)}<X_{S,m}<X_{CS,m}^{(2)}<X_{S,m}^{(1)}<X_{CS,m+1}^{(1)} \quad (11)$$

$$Y_{G,n-1}<Y_{S,n}^{(3)}<Y_{CS,n}^{(1)}<Y_{CS,n}^{(2)}<Y_{S,n}^{(4)}<Y_{CS,n}<Y_{S,n}^{(1)}<Y_{G,n}^{(1)}<Y_{G,n}^{(2)}<Y_{S,n}^{(2)}<Y_{G,n}-T_Y \quad (12)$$

In addition, if the width do of the gate line 13G, the width $d_S$ of the source line 15S, and the width $d_{CS}$ of the auxiliary capacitance line 13CS are taken into consideration, a relationship satisfied by the gate line detour section 50G, the auxiliary capacitance line detour section 50CS, and the source line detour section 50S is derived with reference to FIG. 9 from the aforementioned expressions (3), (11), and (12). This derivation is similar to the derivation of expressions (5-1) to (5-6) from expression (3) and the derivation of expressions (6-1) to (6-5) from expression (4) in the aforementioned embodiment 2, is obvious to a person skilled in the art, and is therefore omitted.

Effects

According to the present embodiment, the isolated region 43 that includes regions where a short circuit may have occurred due to the mechanical dividing of the display panel 2 can be electrically isolated from the display region 41 by radiating laser light along the laser scanning line 25c. Therefore, an effect is demonstrated in that short circuits and display defects caused by the short circuits are reliably removed from the display region 41 of the display panel 2 after having been divided.

In addition, similar to the aforementioned embodiment 2, according to the present embodiment, in a case where the laser light irradiated region L satisfies the relationship of expression (2), the intersection $C_{G,n,m}$, which may short-circuit, is electrically isolated from the display region 41 (FIG. 3). Therefore, the laser light irradiated region L may not satisfy the relationship of expression (1). In addition, according to the present embodiment, the intersection $C_{CS,n,m}$ between an auxiliary capacitance line 13CS and a source line 15S is also likewise electrically isolated from the display region 41.

Embodiment 5

Another embodiment of the present disclosure is as follows when described on the basis of FIGS. 1, 2, and 10. It should be noted that, for convenience of the description, members having the same functions as the members described in the aforementioned embodiment are denoted by the same reference signs and descriptions thereof are omitted.

(Configuration of Liquid Crystal Display Device and Active Matrix Substrate)

FIG. 1 is a top view depicting a schematic configuration of a liquid crystal display device according to the present embodiment.

A liquid crystal display device 1 is provided with a display panel 2, a source driver 3, a gate driver 11, a display control circuit 4, and a power source 5. The display panel 2 is provided with an active matrix substrate 20a, an opposite substrate 20b, and a liquid crystal layer (not depicted) held between these substrates.

FIG. 2 is a top view depicting a schematic configuration of the active matrix substrate 20a.

The active matrix substrate 20a includes an insulating substrate 2a such as a glass substrate, and N gate lines 13G, N auxiliary capacitance lines 13CS, and M source lines 15S formed on the insulating substrate 2a.

In the present embodiment, similar to the aforementioned embodiments 3 and 4, the active matrix substrate 20a includes the auxiliary capacitance lines 13CS.

(Arrangement of Detour Sections and Aperture Ratio)

Figure 10:
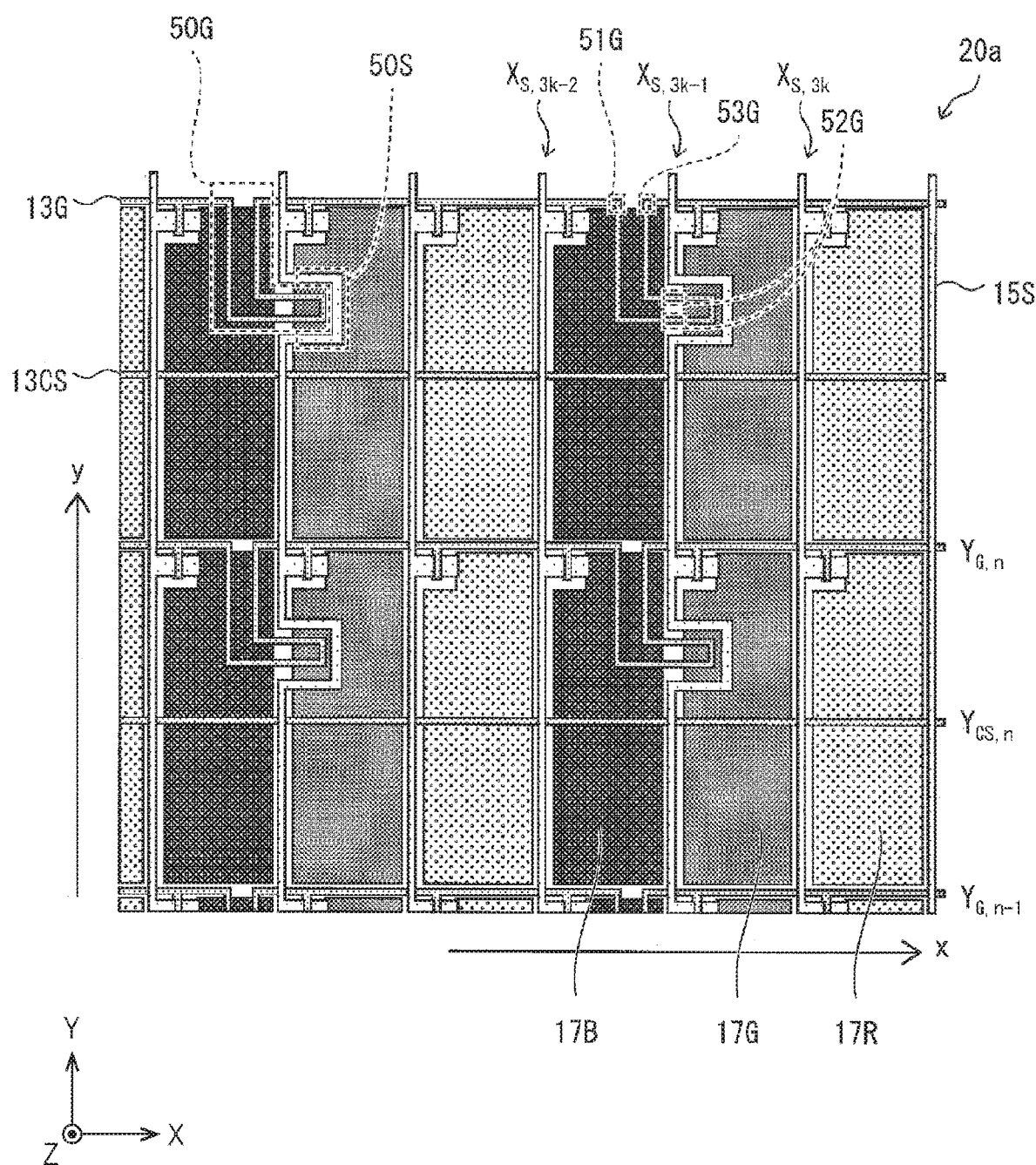
FIG. 10 is a top view depicting a schematic arrangement of gate line detour sections and source line detour sections in an active matrix substrate according to one embodiment of the present disclosure.

FIG. 10 is a top view depicting a schematic arrangement of the gate line detour sections 50G and the source line detour sections 50S in the active matrix substrate 20a of the present embodiment.

In the active matrix substrate 20a, red pixel electrodes 17R for displaying image information for red are provided with respect to the source line 15S of the $3k^{th}$ column. Furthermore, blue pixel electrodes 17B for displaying image information for blue are provided with respect to the source line 15S of the $3k-2^{th}$ column. Furthermore, green pixel electrodes 17G for displaying image information for green are provided with respect to the source line 15S of the 3k-1th column (M=3K, and k is a natural number that is greater than or equal to 1 and less than or equal to K-1).

In the aforementioned embodiment 3, the gate line detour sections 50G and the source line detour sections 50S were provided corresponding to all intersections between the gate lines 13G and the source lines 15S so that the boundary section at the -X side of the laser scanning line 25c may overlap with any of the source lines 15S in the first to $M^{th}$ columns. However, in the present embodiment, the gate line detour sections 50G and the source line detour sections 50S are provided only for intersections corresponding to the green pixel electrodes 17G from among the intersections between the gate lines 13G and the source lines 15S.

In this way, the gate line detour sections 50G and the source line detour sections 50S are provided once every three pixels in the present embodiment, in contrast to being provided once every single pixel in the aforementioned embodiment 3. Therefore, the ratio of the area taken up by the gate line detour sections 50G and the source line detour sections 50S with respect to the display region 41 decreases to approximately ⅓ in the present embodiment in comparison to embodiment 3. Consequently, it is possible to suppress a decrease in the aperture ratio caused by the gate line detour sections 50G and the source line detour sections 50S. Furthermore, in order to suppress this decrease in the aperture ratio, it is preferable for the gate line detour sections 50G and the source line detour sections 50S to have a small area, and to have a shape that is bent in a simple manner as in the examples depicted in FIGS. 6 to 10, for example. It should be noted that the gate line detour sections 50G and the source line detour sections 50S may be provided once every two pixels, twice every three pixels, or once every four or more pixels.

The active matrix substrate 20a in the present embodiment includes: (i) K source lines 15S (first source lines) that transmit source signals for a green component (first source signals) from the −Y direction toward the +Y direction; (ii) N gate lines 13G that intersect the source lines 15S that transmit the source signals for the green component, only at intersections (first intersections) where the gate line detour sections 50G are provided in a corresponding manner, and transmit gate signals from the −X direction toward the +X direction; (iii) N auxiliary capacitance lines 13CS that intersect at intersections (second intersections) with the source lines 15S that transmit the source signals for the green component, and transmit auxiliary capacitance signals from the −X direction toward the +X direction; and (iv) 2K source lines 15S (second source lines) that transmit source signals for a red component and a blue component (second source signals) from the −Y direction toward the +Y direction, intersect at intersections (third intersections) with the gate lines 13G, and intersect at intersections (fourth intersections) with the auxiliary capacitance lines 13CS. In addition, source signals (first source signals) transmitted by source lines 15S (first source lines) that pass through intersections (first intersections) with gate lines 13G on which the gate line detour sections 50G are provided indicate image information for green. Source signals (first source signals) transmitted by source lines 15S (second source lines) that pass through intersections (third intersections) with gate lines 13G on which the gate line detour sections 50G are not provided indicate image information for green and for red, a different color from green.

(Laser Scanning)

With reference to FIG. 10, in a case where the laser light irradiated region L satisfies the relationship of expression (2) with regard to source lines 15S that transmit source signals for a green component, intersections that may short-circuit are electrically isolated from the display region 41 (FIG. 3). However, in a case where the laser light irradiated region L satisfies the relationship of expression (2) with regard to source lines 15S that transmit source signals for a red component and a blue component, intersections that may short-circuit are not electrically isolated from the display region 41. Consequently, it is necessary for the laser light irradiated region L to satisfy the relationship of expression (13) or (14) below derived on the basis of expression (1).

$$X_{S,3k-2}+d_S/2<X_L-r/2<X_{S,3k}-d_S/2 \quad (13)$$

$$X_{S,3k}+d_S/2<X_L-r/2<X_{S,3k+1}-d_S/2 \quad (14)$$

Derived from expression (13), in the present embodiment, the pitch of a sub-pixel is, from p, $2p=X_{S,3k}-X_{S,3k-2}$, and therefore the laser light position tolerance is $\pm(2p-d_S)/2$. In contrast, in embodiment 1 in which the gate line detour sections 50G are not provided, the laser light position tolerance was $\pm(p-d_S)/2$. Consequently, by providing the gate line detour sections 50G for intersections through which some source lines 15S from among the plurality of source lines 15S pass, the laser light position tolerance can be increased.

Effects

According to the present embodiment, the isolated region 43 that includes regions where a short circuit may have occurred due to the mechanical dividing of the display panel 2 can be electrically isolated from the display region 41 by radiating laser light along the laser scanning line 25c. Therefore, an effect is demonstrated in that short circuits and display defects caused by the short circuits are reliably removed from the display region 41 of the display panel 2 after having been divided.

In addition, by providing the gate line detour sections 50G for intersections through which some source lines 15S from among the plurality of source lines 15S pass, the laser light position tolerance can be increased. Furthermore, it is possible to suppress a decrease in the aperture ratio of the display panel 2 caused by the gate line detour sections 50G and the source line detour sections 50S.

Embodiment 6

Figure 11:
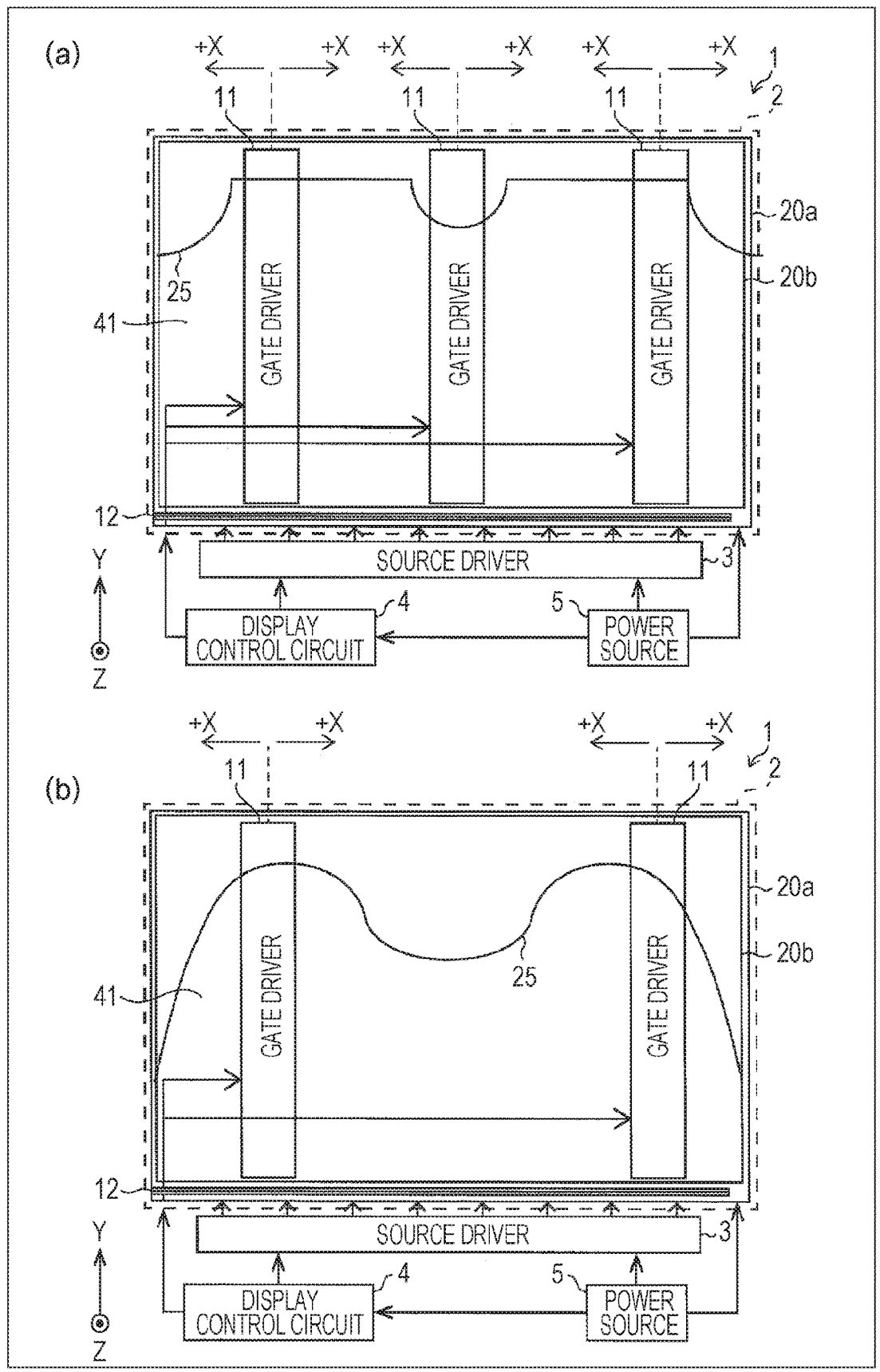
FIG. 11 is a top view depicting a schematic configuration of (a) one working example and (b) another working example of a liquid crystal display device according to one embodiment of the present disclosure.
Figure 12:
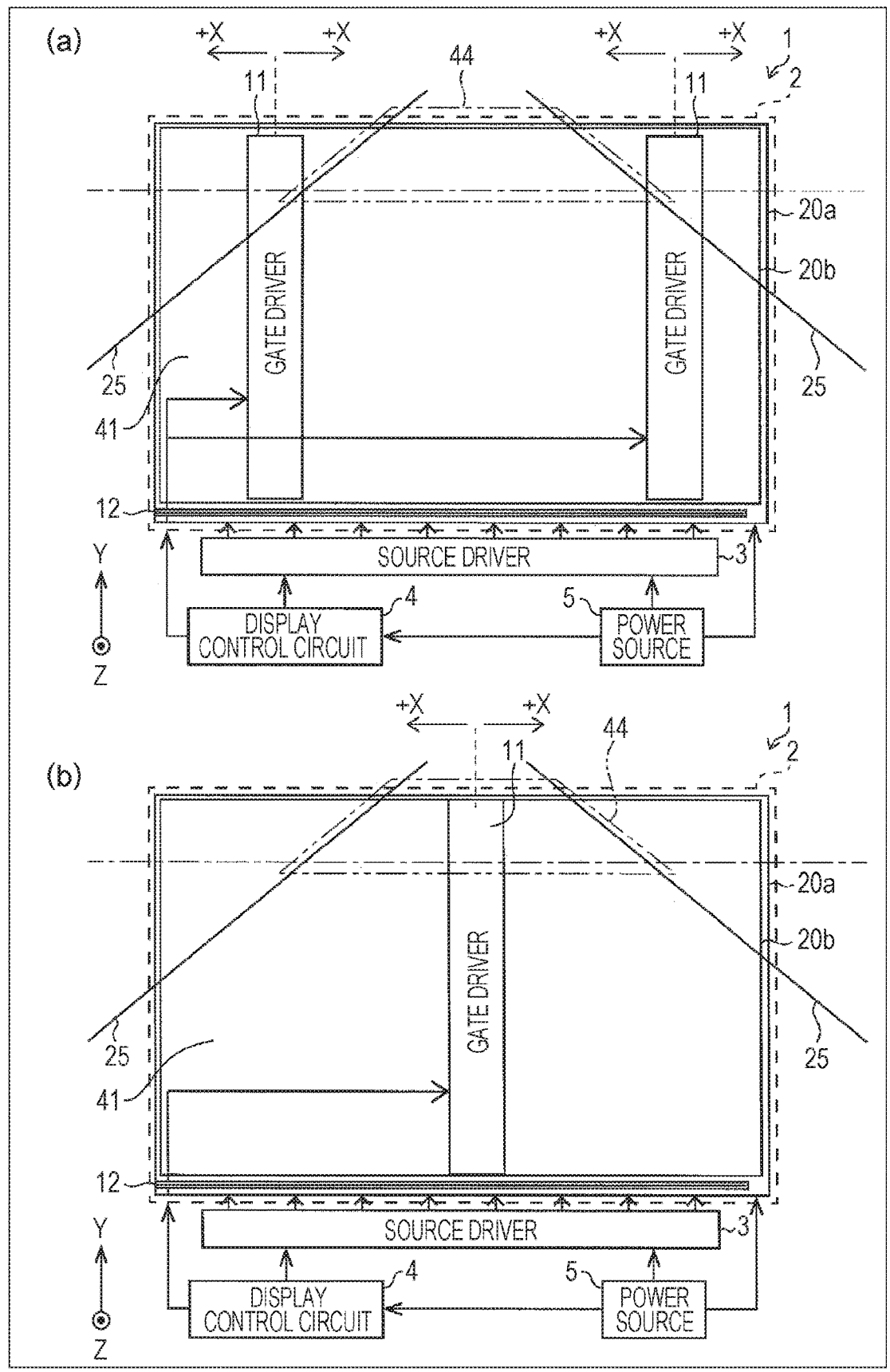
FIG. 12 is a top view depicting the relationship between the shape of a dividing line and the arrangement of a gate driver, in a liquid crystal display device according to one embodiment of the present disclosure.

Another embodiment of the present disclosure is as follows when described on the basis of FIGS. 11, 12, and 13. It should be noted that, for convenience of the description, members having the same functions as the members described in the aforementioned embodiment are denoted by the same reference signs and descriptions thereof are omitted.

(Configuration of Liquid Crystal Display Device and Active Matrix Substrate)

FIGS. 11(a) and (b) are top views depicting schematic configurations of different working examples of a liquid crystal display device 1 according to the present embodiment.

The liquid crystal display device 1 is provided with a display panel 2, a source driver 3, a gate driver 11, a display control circuit 4, and a power source 5. The display panel 2 is provided with an active matrix substrate 20a, an opposite substrate 20b, and a liquid crystal layer (not depicted) held between these substrates.

In the present embodiment, similar to the aforementioned embodiment 3, the active matrix substrate 20a includes an insulating substrate 2a, N gate lines 13G, N auxiliary capacitance lines 13CS, and M source lines 15S, with gate line detour sections 50G being provided in the gate lines 13G, and source line detour sections 50S being provided in the source lines 15S.

In the present embodiment, different from the aforementioned embodiments 1 to 5, a gate driver 11 or part of the gate driver 11 is formed inside pixel regions, which are regions in which a pixel electrode is arranged corresponding to a gate line 13G and a source line 15S.

This kind of technique in which at least part of the gate driver 11 is formed within pixel regions defined by source lines 15S and gate lines 13G is described in PTL 3 (International Publication No. WO2014/069529), for example. According to the technique described in PTL 3, the gate driver 11 (i) is connected to at least some wiring including a gate line 13G, (ii) controls the potential of the wiring including the gate line 13G in accordance with a control signal supplied from outside a display region that includes the pixel regions defined by the gate lines 13G and the source lines 15S, and (iii) includes a plurality of switching elements (second switching elements) at least some of which are formed in the pixel regions. PTL 3 is cited herein for reference.

Due to at least part of the gate driver 11 being provided inside the pixel regions, the dividing lines 25 along which the display panel 2 is divided can be altered to lines having various shapes. Consequently, in addition to altering the size of the display panel 2, it becomes possible to alter the shape of the display panel 2 to various shapes such as those in FIGS. 11(a) and (b). It should be noted that the scope of the present disclosure is not restricted hereto, and the technique in which at least part of the gate driver 11 is formed inside the pixel regions may be combined with any of the aforementioned embodiments 1, 2, 4, and 5.

(X Axis Direction)

As described with reference to FIG. 6 in the aforementioned embodiments 2 and 3, the gate line detour sections 50G and the source line detour sections 50S are defined on the basis of the transmission directions of gate signals and source signals and the positions of intersections between the gate line 13G and the source line 15S. Consequently, as in FIG. 11, in a case where the gate driver 11 is provided inside the display region 41, and in a case where the gate driver 11 is provided in plurality, the X axis direction is set so that gate signals are transmitted from the −X direction toward the +X direction. Specifically, the direction going away from each gate driver 11 is taken as the +X direction and the direction coming toward each gate driver 11 is taken as the −X direction.

(Shape)

FIGS. 12(a) and (b) are top views depicting the relationship between the shape of the dividing lines 25 and the arrangement of the gate drivers 11, in the liquid crystal display device 1 device according to the present embodiment.

When reference is made to FIG. 12(a), the gate drivers 11 are provided with one at the left and one at the right, on the active matrix substrate 20a provided in the display panel 2. In the display panel 2 divided according to the dividing lines 25 depicted in FIG. 12(a), gate lines 13G that pass within a region 44 are divided according to the dividing lines 25 and are not connected to the gate drivers 11. Therefore, within the region 44, gate signals are not transmitted and therefore images are not displayed.

However, when reference is made to FIG. 12(b), one gate driver 11 is provided in the center of the active matrix substrate 20a provided in the display panel 2. In the display panel 2 divided according to the dividing lines 25 depicted in FIG. 12(b), gate lines 13G that pass within the region 44 are connected to the gate driver 11 at the upper side of the display panel 2. Therefore, within the region 44, gate signals are transmitted and images are displayed.

Consequently, when reference is made to FIGS. 12(a) and (b) in comparison, the gate drivers 11 are arranged so as to conform to the shape of the dividing lines 25, or the shape of the dividing lines 25 is set so as to conform to the arrangement of the gate drivers 11. Specifically, the gate drivers 11 are arranged and/or the shape of the dividing lines 25 is set so that both gate signals and source signals are transmitted to all pixels included within the display region 41 after having been divided, so that each gate line 13G included within the divided display region 41 is connected to the gate drivers 11, and so that each source line 15S included within the divided display region 41 is connected to the source driver 3.

At such time, the longest length in the Y axis direction of the gate drivers 11 included in the display region 41 of the display panel 2 after having been divided and the longest length in the Y axis direction of the display region 41 match each other. This is because (i) the gate drivers 11 are divided according to the dividing lines 25 together with the active matrix substrate 20a and therefore the gate drivers 11 are never longer than the display region 41, and (ii) in a case where the gate drivers 11 are shorter than the longest length of the display region 41, a region where display is not possible is formed, such as the region 44 of FIG. 12(a).

(Dividing Lines)

Figure 13:
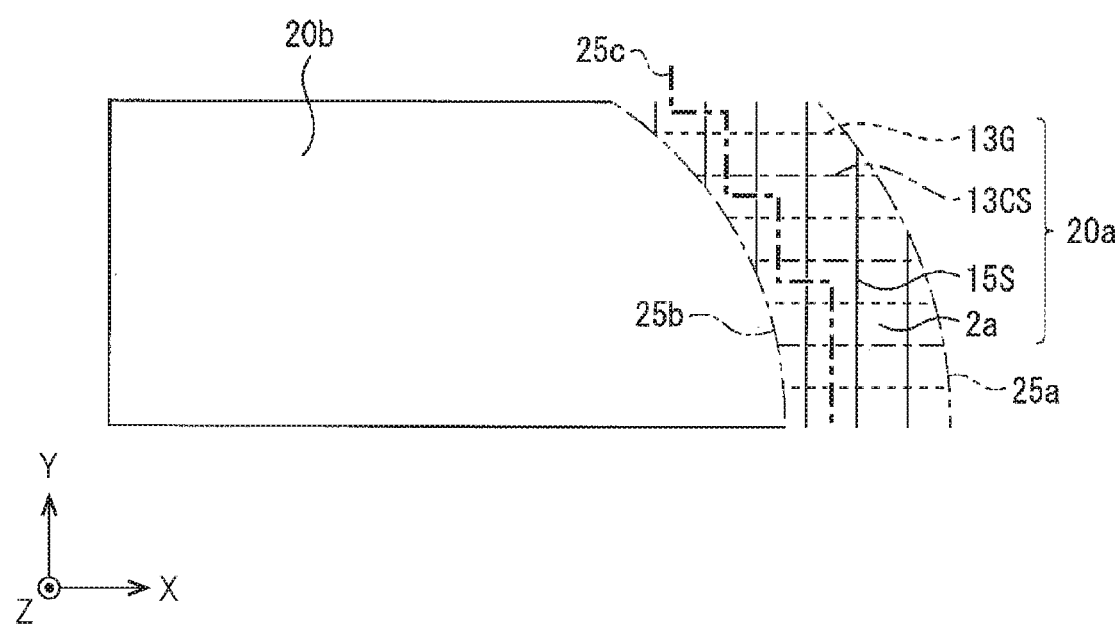
FIG. 13 is a top view depicting a schematic configuration of a dividing line according to one embodiment of the present disclosure.

FIG. 13 is a top view depicting a schematic configuration of the dividing lines 25 according to the present embodiment.

In the case where the dividing lines 25 were straight lines as in FIG. 3, and also in the case of not being straight lines as in FIG. 13, it is preferable for the gap between the active matrix substrate dividing line 25a and the opposite substrate dividing line 25b to be 0.5 mm to 2 mm. Furthermore, as in FIG. 13, in a case where the active matrix substrate dividing line 25a and the opposite substrate dividing line 25b are curves, the laser scanning line 25c is set so as to have a stepped form along a grid formed by the gate lines 13G and the source lines 15S, at an outer side along the active matrix substrate dividing line 25a.

SUMMARY

An active matrix substrate (20a) according to aspect 1 of the present disclosure is a configuration including: a plurality of source lines (15S) including a plurality of first source lines that transmit a first source signal from a −Y direction toward a +Y direction; and a plurality of gate lines (13G) that intersect the plurality of first source lines only at a plurality of first intersections, and transmit a gate signal from a −X direction toward a +X direction, in the gate lines, gate line detour sections (50G) being provided corresponding to each of the first intersections, and each of the gate line detour sections having: a first start section (51G) in which the corresponding gate line is bent toward the +Y direction or the −Y direction from a first start position ($X_{G,m}^{(1)}$ with reference to FIGS. 6 and 8) that is in the −X direction relative to the corresponding first intersection ($C_{G,n,m}$ with reference to FIGS. 6 and 8); and first straddling sections (52G) in which the corresponding gate line straddles a first straight line that passes through a +X direction end ($X_{S,m}$+ $d_S/2$ with reference to FIGS. 6 and 8) of the corresponding first intersection and extends in the +Y direction and the −Y direction.

According to the aforementioned configuration, in a case where a boundary section at the −X direction side between an irradiated region, where laser light is radiated onto the active matrix substrate for the gate lines to be divided, and a non-irradiated region superposes a first intersection, the boundary section also superposes the first straddling sections of the gate line detour section corresponding to the first intersection. Therefore, the gate lines are invariably divided at the first straddling sections and/or between the first straddling sections of the corresponding gate line detour section, and therefore, in a case where a boundary section superposes a first intersection, the corresponding gate line detour section is divided. Consequently, a first intersection that may have short-circuited due to superposing a boundary section between an irradiated region and a non-irradiated region is isolated from intersections (including first intersections) between gate lines and source lines that are in the −X direction relative to the first intersection.

Consequently, in a display panel provided with an active matrix substrate having the aforementioned configuration, with laser scanning that is carried out once, (i) regions where a short circuit may have occurred due to mechanical dividing and (ii) first intersections where a short circuit may have occurred due to the radiation of a laser in the laser scanning can be isolated from a display region. Therefore, it is permissible for the first intersections to short-circuit due to the radiation of a laser. Furthermore, as a result, laser scanning can be carried out so as to pass through positions near the first intersections, and the position tolerance of the laser scanning may be increased.

According to the aforementioned configuration, gate lines intersect first source lines only at first intersections, and the gate line detour sections start from a first start position that is in the −X direction relative to a first intersection, and straddle a first straight line that passes through the +X direction end of the first intersection. Consequently, the gate line detour sections straddle the first straight line from the −X direction toward the +X direction, and thereafter straddle the first straight line so as to return from the +X direction toward the −X direction.

An active matrix substrate (20a) according to aspect 2 of the present disclosure may be a configuration in which, in the aforementioned aspect 1, source line first detour sections (50S) in which the first source lines detour around the gate line detour sections (50G) are provided in the first source lines (15S).

According to the aforementioned configuration, the first source lines detour in such a way as to not superpose the gate line detour sections. Therefore, it is possible for the gate lines to intersect the first source lines only at the first intersections.

An active matrix substrate (20a) according to aspect 3 of the present disclosure may be a configuration in which, in the aforementioned aspect 2, the gate lines (13G) of the gate line detour sections (50G) and the first source lines (15S) of the source line first detour sections (50S) pass through positions that are different from a plurality of first switching elements (T) that correspond to the first intersections.

According to the aforementioned configuration, the gate lines of the gate line detour sections and the first source lines of the source line first detour sections pass through positions that are different from the first switching elements. Therefore, it becomes possible for the gate line detour sections and the source line first detour sections to not superpose the first switching elements.

An active matrix substrate (20a) according to aspect 4 of the present disclosure may be a configuration in which, in any one aspect of the aforementioned aspects 1 to 3, each of the gate line detour sections (50G) has a first end section (53G) in which the corresponding gate line (13G) returns to a first end position ($X_{G,m}^{(3)}$ with reference to FIGS. 6 and 8) that is in the −X direction relative to the corresponding first intersection ($C_{G,n,m}$ with reference to FIGS. 6 and 8) and in the +X direction relative to the first start position ($X_{G,m}^{(1)}$ with reference to FIGS. 6 and 8), and each of the gate lines connects between the first intersections and the corresponding first end positions, and connects between the corresponding first end positions and the corresponding first start positions by means of only the gate line detour sections.

According to the aforementioned configuration, a first end position and a first start position corresponding to the same first intersection are connected by means of only the corresponding gate line detour section. Consequently, when a gate line detour section is divided, the corresponding first intersection is isolated from other first intersections that are in the −X direction.

An active matrix substrate (20a) according to aspect 5 of the present disclosure may be a configuration that, in any one aspect of the aforementioned aspects 1 to 4, further includes a plurality of auxiliary capacitance lines (13CS) that intersect the plurality of first source lines (15S) only at a plurality of second intersections, and transmit an auxiliary capacitance signal from the −X direction toward the +X direction.

An active matrix substrate (20a) according to aspect 6 of the present disclosure may be a configuration in which, in the aforementioned aspect 5, in the auxiliary capacitance lines (13CS), auxiliary capacitance line detour sections (50CS) are provided corresponding to each of the second intersections, and each of the auxiliary capacitance line detour sections has: a second start section in which the corresponding auxiliary capacitance line is bent toward the +Y direction or the −Y direction from a second start position ($X_{CS,m}^{(1)}$ with reference to FIG. 9) that is in the −X direction relative to the corresponding second intersection ($C_{CS,n,m}$ with reference to FIG. 9); and second straddling sections (52CS) in which the corresponding auxiliary capacitance line straddles a second straight line that passes through a +X direction end ($X_{S,m}+d_S/2$ with reference to FIG. 9) of the corresponding second intersection and extends in the +Y direction and the −Y direction.

According to the aforementioned configuration, in a case where a boundary section at the −X direction side between an irradiated region, where laser light is radiated onto the active matrix substrate, and a non-irradiated region superposes a second intersection, the boundary section also superposes the second straddling sections of the auxiliary capacitance line detour section corresponding to the second intersection. Therefore, the auxiliary capacitance lines are invariably divided at the second straddling sections and/or between the second straddling sections of the corresponding auxiliary capacitance line detour section, and therefore, in a case where a boundary section superposes a second intersection, the corresponding auxiliary capacitance line detour section is divided. Consequently, a second intersection that may have short-circuited due to superposing a boundary section between an irradiated region and a non-irradiated region is isolated from intersections (including second intersections) between auxiliary capacitance lines and source lines that are in the −X direction relative to the second intersection.

An active matrix substrate (20a) according to aspect 7 of the present disclosure may be a configuration in which, in the aforementioned aspect 6, source line second detour sections (50G) in which the first source lines detour around the auxiliary capacitance line detour sections (50CS) are provided in the first source lines (15S).

According to the aforementioned configuration, the first source lines detour in such a way as to not superpose the auxiliary capacitance line detour sections. Therefore, it is possible for the auxiliary capacitance lines to intersect the first source lines only at the second intersections.

An active matrix substrate (20a) according to aspect 8 of the present disclosure may be a configuration in which, in the aforementioned aspect 7, the auxiliary capacitance lines (13CS) of the auxiliary capacitance line detour sections (50CS) and the first source lines (15S) of the source line second detour sections (50S) pass through positions that are different from the plurality of first switching elements (T) that correspond to the first intersections.

According to the aforementioned configuration, the auxiliary capacitance lines of the auxiliary capacitance line detour sections and the first source lines of the source line second detour sections pass through positions that are different from the first switching elements. Therefore, it becomes possible for the auxiliary capacitance line detour sections and the source line second detour sections to not superpose the first switching elements.

An active matrix substrate (20a) according to aspect 9 of the present disclosure may be a configuration in which, in any one aspect of the aforementioned aspects 6 to 8, each of the auxiliary capacitance line detour sections (50CS) has a second end section (53CS) in which the corresponding auxiliary capacitance line returns to a second end position ($X_{CS,m}^{(3)}$ with reference to FIG. 9) that is in the −X direction relative to the corresponding second intersection ($C_{CS,n,m}$ with reference to FIG. 9) and in the +X direction relative to the second start position ($X_{CS,m}^{(1)}$ with reference to FIG. 9), and each of the auxiliary capacitance lines connects between the second intersections and the corresponding second end positions, and connects between the corresponding second end positions and the corresponding second start positions by means of only the auxiliary capacitance line detour sections.

According to the aforementioned configuration, a second end position and a second start position corresponding to the same second intersection are connected by means of only the corresponding auxiliary capacitance line detour section. Consequently, when an auxiliary capacitance line detour section is divided, the corresponding second intersection is isolated from other second intersections that are in the −X direction.

An active matrix substrate according to aspect 10 of the present disclosure may be a configuration in which, in any one aspect of the aforementioned aspects 1 to 9, the plurality of source lines further include a plurality of second source lines that transmit a second source signal from the −Y direction toward the +Y direction, and intersect the plurality of gate lines only at third intersections.

According to the aforementioned configuration, gate line detour sections corresponding to the third intersections may not be provided in the gate lines. Thus, it is possible to suppress the area taken up by the gate line detour sections with respect to pixel regions defined by the plurality of source lines and the plurality of gate lines, and it is possible to suppress a decrease in the aperture ratio caused by the gate line detour sections.

An active matrix substrate according to aspect 11 of the present disclosure may be a configuration in which, in any one aspect of the aforementioned aspects 5 to 9, the plurality of source lines further include a plurality of second source lines that transmit a second source signal from the −Y direction toward the +Y direction, intersect the plurality of gate lines only at third intersections, and intersect the plurality of auxiliary capacitance lines only at fourth intersections.

According to the aforementioned configuration, gate line detour sections corresponding to the third intersections may not be provided in the gate lines. Thus, it is possible to suppress the area taken up by the gate line detour sections with respect to pixel regions defined by the plurality of source lines and the plurality of gate lines, and it is possible to suppress a decrease in the aperture ratio caused by the gate line detour sections.

An active matrix substrate (20a) according to aspect 12 of the present disclosure may be a configuration in which, in the aforementioned aspect 10 or 11, the second source signal (image information for red and image information for blue) indicates image information for a color that is different from the first source signal (image information for green).

An active matrix substrate (20a) according to aspect 13 of the present disclosure may be a configuration that, in any one aspect of the aforementioned aspects 1 to 12, further includes a gate driving circuit (gate driver 11) that supplies the gate signal to at least some of the plurality of gate lines (13G), and has a plurality of second switching elements, at least some of the plurality of second switching elements being formed in pixel regions defined by the plurality of source lines and the plurality of gate lines.

According to the aforementioned configuration, in addition to altering the size of the active matrix substrate, it becomes possible to also alter the shape.

An active matrix substrate (20a) according to aspect 14 of the present disclosure may be a configuration in which, in any one aspect of the aforementioned aspects 1 to 13, the +X and −X directions and the +Y and −Y directions are mutually orthogonal.

A display panel (2) according to aspect 15 of the present disclosure is a configuration provided with: the active matrix substrate (20a) according to any one of the aforementioned aspects 1 to 14; an opposite substrate (20b); and a liquid crystal layer held between the active matrix substrate and the opposite substrate.

According to the aforementioned configuration, it is possible to realize a display panel provided with an active matrix substrate according to an embodiment of the present disclosure.

A display device according to aspect 16 of the present disclosure is a configuration provided with the display panel according to the aforementioned aspect 15.

According to the aforementioned configuration, it is possible to realize display device provided with a display panel according to an embodiment of the present disclosure.

The present invention is not restricted to the aforementioned embodiments, various alterations are possible within the scope indicated in the claims, and embodiments obtained by appropriately combining the technical means disclosed in each of the different embodiments are also included within the technical scope of the present invention. In addition, novel technical features can be formed by combining the technical means disclosed in each of the embodiments.

REFERENCE SIGNS LIST

1 Liquid crystal display device (display device)
2 Display panel
11 Gate driver (gate driving circuit)
13CS Auxiliary capacitance line
13G Gate line
15S Source line (first source line, second source line)
20a Active matrix substrate
20b Opposite substrate
30 Liquid crystal layer
50CS Auxiliary capacitance line detour section
50G Gate line detour section
50S Source line detour section (source line first detour section, source line second detour section)
51CS Start section (second start section)
51G Start section (first start section)
52CS Straddling section (second straddling section)
52G Straddling section (first straddling section)
53CS End section (second end section)
53G End section (first end section)

The invention claimed is:
1. An active matrix substrate including:
a plurality of source lines including a plurality of first source lines that transmit a first source signal from a −Y direction toward a +Y direction; and
a plurality of gate lines that intersect the plurality of first source lines only at a plurality of first intersections, and transmit a gate signal from a −X direction toward a +X direction, in the gate lines, gate line detour sections being provided corresponding to each of the first intersections, and each of the gate line detour sections having:

a first start section in which the corresponding gate line is bent toward the +Y direction or the −Y direction from a first start position that is in the −X direction relative to the corresponding first intersection; and first straddling sections in which the corresponding gate line straddles a first straight line that passes through a +X direction end of the corresponding first intersection and extends in the +Y direction and the −Y direction.

2. The active matrix substrate according to claim 1, Wherein source line first detour sections in which the first source lines detour around the gate line detour sections are provided in the first source lines.

3. The active matrix substrate according to claim 2, wherein the gate lines of the gate line detour sections and the first source lines of the source line first detour sections pass through positions that are different from a plurality of first switching elements that correspond to the first intersections.

4. The active matrix substrate according to claim 1, wherein each of the gate line detour sections has a first end section in which the corresponding gate line returns to a first end position that is in the −X direction relative to the corresponding first intersection and in the +X direction relative to the first start position, and each of the gate lines connects between the first intersections and the corresponding first end positions, and connects between the corresponding first end positions and the corresponding first start positions by means of only the gate line detour sections.

5. The active matrix substrate according to claim 1, further including a plurality of auxiliary capacitance lines that intersect the plurality of first source lines only at a plurality of second intersections, and transmit an auxiliary capacitance signal from the −X direction toward the +X direction.

6. The active matrix substrate according to claim 5, wherein, in the auxiliary capacitance lines, auxiliary capacitance line detour sections are provided corresponding to each of the second intersections, and each of the auxiliary capacitance line detour sections has:

a second start section in which the corresponding auxiliary capacitance line is bent toward the +Y direction or the −Y direction from a second start position that is in the −X direction relative to the corresponding second intersection; and second straddling sections in which the corresponding auxiliary capacitance line straddles a second straight line that passes through a +X direction end of the corresponding second intersection and extends in the +Y direction and the −Y direction.

7. The active matrix substrate according to claim 6, wherein source line second detour sections in which the first source lines detour around the auxiliary capacitance line detour sections are provided in the first source lines.

8. The active matrix substrate according to claim 7, wherein the auxiliary capacitance lines of the auxiliary capacitance line detour sections and the first source lines of the source line second detour sections pass through positions that are different from the plurality of first switching elements that correspond to the first intersections.

9. The active matrix substrate according to claim 6, wherein each of the auxiliary capacitance line detour sections has a second end section in which the corresponding auxiliary capacitance line returns to a second end position that is in the −X direction relative to the corresponding second intersection and in the +X direction relative to the second start position, and each of the auxiliary capacitance lines connects between the second intersections and the corresponding second end positions, and connects between the corresponding second end positions and the corresponding second start positions by means of only the auxiliary capacitance line detour sections.

10. The active matrix substrate according to claim 1, wherein the plurality of source lines further include a plurality of second source lines that transmit a second source signal from the −Y direction toward the +Y direction, and intersect the plurality of gate lines only at third intersections.

11. The active matrix substrate according to claim 5, wherein the plurality of source lines further include a plurality of second source lines that transmit a second source signal from the −Y direction toward the +Y direction, intersect the plurality of gate lines only at third intersections, and intersect the plurality of auxiliary capacitance lines only at fourth intersections.

12. The active matrix substrate according to claim 10, wherein the second source signal indicates image information for a color that is different from the first source signal.

13. The active matrix substrate according to claim 1, further including a gate driving circuit that supplies the gate signal to at least some of the plurality of gate lines, and has a plurality of second switching elements, and at least some of the plurality of second switching elements being formed in pixel regions defined by the plurality of source lines and the plurality of gate lines.

14. The active matrix substrate according to claim 1, wherein the +X and −X directions and the +Y and −Y directions are mutually orthogonal.

15. A display panel comprising:

the active matrix substrate according to claim 1;

an opposite substrate; and a liquid crystal layer held between the active matrix substrate and the opposite substrate.

16. A display device comprising the display panel according to claim 15.

* * * * *